United States Patent
Kuritsyn et al.

(10) Patent No.: US 10,101,664 B2
(45) Date of Patent: Oct. 16, 2018

(54) APPARATUS AND METHODS FOR OPTICS PROTECTION FROM DEBRIS IN PLASMA-BASED LIGHT SOURCE

(71) Applicant: KLA-Tencor Corporation, Milpitas, CA (US)

(72) Inventors: Alexey Kuritsyn, San Jose, CA (US); Ye Liu, San Jose, CA (US); Oleg Khodykin, San Diego, CA (US); Michael P. Kanouff, Livermore, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/739,305

(22) Filed: Jun. 15, 2015

(65) Prior Publication Data
US 2016/0128171 A1 May 5, 2016

Related U.S. Application Data

(60) Provisional application No. 62/074,001, filed on Nov. 1, 2014.

(51) Int. Cl.
*H05G 2/00* (2006.01)
*G03F 7/20* (2006.01)

(52) U.S. Cl.
CPC ...... *G03F 7/70033* (2013.01); *G03F 7/70916* (2013.01); *G03F 7/70933* (2013.01)

(58) Field of Classification Search
CPC ... H05G 2/00; G02F 7/70033; G02F 7/70916; G02F 7/70933
See application file for complete search history.

(56) References Cited

U.S. PATENT DOCUMENTS 3,669,831 A  6/1972  Dupasquier
3,714,864 A * 2/1973  Thierry .................. F41A 21/38
                                                    89/14.3

(Continued)

FOREIGN PATENT DOCUMENTS

WO  1991002236 A1  2/1991
WO  2009025557 A1  2/2009

OTHER PUBLICATIONS

Tezuka et al. 'Actinic detection of multilayer defects on EUV mask blanks using LPP light source and dark-field imaging' Proceedings of SPIE vol. 5374 (Bellingham, WA, 2004), pp. 271-280.*

(Continued)

*Primary Examiner* — Eliza Osenbaugh-Stewart
(74) *Attorney, Agent, or Firm* — Kwan & Olynick, LLP

(57) ABSTRACT

Disclosed are methods and apparatus for generating an illumination beam. In one embodiment, the apparatus includes a vacuum chamber configured to hold a target material, an optical element positioned within the vacuum chamber or within a wall of such vacuum chamber, and an illumination source system for generating at least one excitation source that is focused on the target in the vacuum chamber for generating a plasma in the vacuum chamber so as to produce illumination radiation. The apparatus further includes a debris protection system for flowing gas out of a plurality of nozzles and away from the optical element at a velocity towards the plasma so as to prevent debris from reaching such optical element.

20 Claims, 19 Drawing Sheets

(56) References Cited

U.S. PATENT DOCUMENTS

| | | | |
|---|---|---|---|
| 6,486,478 B1* | 11/2002 | Libby | H01J 37/3053 204/192.1 |
| 6,507,031 B1* | 1/2003 | Jinbo | H01L 21/02046 134/1 |
| 6,872,259 B2 | 3/2005 | Strang | |
| 7,109,503 B1 | 9/2006 | Bowering et al. | |
| 7,247,870 B2 | 7/2007 | Ershov et al. | |
| 7,355,191 B2 | 4/2008 | Bykanov et al. | |
| 7,365,351 B2 | 4/2008 | Bowering et al. | |
| 7,402,825 B2 | 7/2008 | Simmons et al. | |
| 7,453,077 B2 | 11/2008 | Bowering et al. | |
| 7,655,925 B2 | 2/2010 | Bykanov et al. | |
| 7,750,327 B2 | 7/2010 | Tran et al. | |
| 7,875,864 B2 | 1/2011 | Sogard | |
| 8,256,441 B2 | 9/2012 | Moriya et al. | |
| 8,519,366 B2 | 8/2013 | Bykanov et al. | |
| 2003/0156152 A1* | 8/2003 | Ray | B08B 5/02 347/25 |
| 2006/0289806 A1* | 12/2006 | Simmons | H05G 2/001 250/493.1 |
| 2007/0080307 A1 | 4/2007 | Bruijn et al. | |
| 2008/0087847 A1* | 4/2008 | Bykanov | G03F 7/70033 250/504 R |
| 2009/0073396 A1* | 3/2009 | Gabriel Van De Vijver | B82Y 10/00 355/30 |
| 2009/0218521 A1* | 9/2009 | Sogard | G02B 1/06 250/504 R |
| 2010/0025231 A1* | 2/2010 | Moriya | H05G 2/001 204/192.32 |
| 2010/0032590 A1 | 2/2010 | Bykanov et al. | |
| 2011/0188014 A1* | 8/2011 | Banine | G03F 7/70033 355/30 |
| 2012/0327381 A1* | 12/2012 | Labetski | G02B 5/00 355/30 |
| 2013/0313423 A1 | 11/2013 | Umstadter | |
| 2014/0109899 A1* | 4/2014 | Boucher | A61M 11/06 128/200.18 |
| 2014/0306115 A1* | 10/2014 | Kuritsyn | G02B 27/0006 250/358.1 |

OTHER PUBLICATIONS

"International Application Serial No. PCT/US2015/058650, Search Report dated Feb. 16, 2016", 12 pgs.

* cited by examiner

APPARATUS AND METHODS FOR OPTICS PROTECTION FROM DEBRIS IN PLASMA-BASED LIGHT SOURCE

CROSS-REFERENCE TO RELATED APPLICATION

This application claims priority of U.S. Provisional Patent Application No. 62/074,001, entitled "Method and Apparatus to Protect Internal Optical Elements for LPP EUV Source, filed 1 Nov. 2014 by Ye Liu et al., which application is herein incorporated by reference in its entirety for all purposes.

TECHNICAL FIELD OF THE INVENTION

The invention generally relates to the field of plasma-based illumination source systems, especially in the context of reticle inspection. More particularly the present invention relates to apparatus and techniques for protecting illumination source elements from debris generated in such plasma-based illumination source system.

BACKGROUND

Plasma-based illumination source systems, such as laser-produced plasma (LPP) sources, laser-sustained plasma (LSP) sources, laser-driven light sources (LDLS), or discharge-produced plasma (DPP) sources, are often used to generate soft x-ray, extreme ultraviolet (EUV), and vacuum ultraviolet (VUV) wavelengths of illumination (e.g. wavelengths around 120 nm or shorter) for applications such as defect inspection, photolithography, or metrology. The illumination may be emitted by a plasma that is generated at or near a site where target material (e.g. xenon, tin, or lithium) is deposited and irradiated by an excitation source, such as a laser. Illumination emanating from the plasma may be collected and directed and/or focused along an illumination delivery path.

Plasma-based light sources, such as EUV, used for lithography, mask inspection and metrology also suffer from debris generated as a by-product of the plasma formation process, which can include high energy ions and neutrals, atomic clusters, condensable vapor, particles, etc. These undesired by-products can cause serious damage and shorten lifetime of optical elements placed inside the EUV source vacuum chamber, e.g., laser entrance window, EUV collector, metrology windows and mirrors, detectors, etc.

There is a continuing need for improved mechanisms for protecting illumination source elements in plasma-based illumination generation or source systems from debris.

SUMMARY

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

In one embodiment, a plasma-based illumination apparatus for generating radiation is disclosed. The apparatus includes a vacuum chamber configured to hold a target material, an optical element positioned within the vacuum chamber or within a wall of such vacuum chamber, an illumination source system for generating at least one excitation source that is focused on the target in the vacuum chamber for generating a plasma in the vacuum chamber so as to produce illumination radiation, a collector system for collecting and directing the produced illumination radiation towards a sample. The apparatus further includes a debris protection system for flowing gas out of a plurality of nozzles and away from the optical element at a velocity towards the plasma so as to prevent debris from reaching such optical element resulting in a Peclet number averaged over a protected area of the optical element that is greater than or equal to 2. In other embodiments, the resulting Peclet number that is averaged over a protected area is greater than or equal to 4.

In a specific implementation, the produced radiation has an extreme ultraviolet (EUV) wavelength range that is equal to or less than 13.5 nm and the gas transmits EUV light. In a further aspect, the optical element is an entrance window of the chamber that is positioned between about 0.1 to 2.5 meters from the target material. In another aspect, the optical element is a collector element, a metrology window, a filter, a deflector, or a mirror.

In another aspect, an area occupied by a plurality of openings of the nozzles is smaller than a surface area of the optical element. In yet another aspect, a flow rate of the gas is less than 20 standard liters per minute (slm). In a specific embodiment, the gas comprises one or more of the following gases: Ar, $H_2$, He, $Br_2$, HBr, or $N_2$. In another aspect, each nozzle has a circular hole and the plurality of nozzles are arranged to produce a uniform gas stream, a planar gas curtain, or a ring-shaped jet. In another implementation, the debris protection system further comprises a manifold fluidly coupled between the nozzles and a gas source or gas inlet, and the manifold has a higher gas conductance than all the nozzles combined. In a further aspect, the debris protection system includes a gas cone for directing the gas towards the plasma or another debris source. In a specific implementation, the nozzles are evenly distributed. In another aspect, the nozzles have a count and/or size and/or temperature that is selected by a computational fluid dynamics simulation to provide a predefined level of optics protection and to avoid gas condensation.

In another feature, the apparatus includes a pellicle positioned in front of the optical element. In another embodiment, the optical element is an entrance window in the wall of the vacuum chamber through which the focused excitation source is received. In a further aspect, the apparatus includes a pellicle positioned between the optical element and a source of debris, and the pellicle and/or entrance window are comprised of a sapphire material.

In yet another implementation, the apparatus includes an expansion stage fluidly coupled between each nozzle and the vacuum chamber, and the expansion stage for each nozzle has a diameter larger than a diameter of such nozzle and smaller than a diameter of the vacuum chamber. In another aspect, the apparatus includes a baffle positioned downstream of each nozzle. In yet another example implementation, the apparatus includes a heating system for increasing a temperature of each nozzle to prevent condensation of the gas at each nozzle's exit.

In an alternative embodiment, the invention pertains to an inspection system for inspecting a photolithographic reticle or wafer for defects, and the sample is a wafer or reticle. The system comprises an apparatus for generating the illumination beam and having any one or more of the above-recited features. This system further includes imaging optics for directing the illumination radiation towards the reticle or wafer, a detector for receiving a detected signal or image from the reticle or sample in response to the illumination radiation being directed to the reticle or wafer, and a processor and memory that are configured to analyze the detected signal or image to thereby detect defects on the reticle or wafer.

In another embodiment, the invention pertains to a photolithography system for transferring a pattern from a reticle onto a wafer. This system includes an apparatus for generating the illumination beam and having one or more of the above-recited features. The system also includes imaging optics for directing the illumination radiation via a reticle onto a wafer.

These and other aspects of the invention are described further below with reference to the figures.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known component or process operations have not been described in detail to not unnecessarily obscure the present invention. While the invention will be described in conjunction with the specific embodiments, it will be understood that it is not intended to limit the invention to the embodiments.

Figure 1A:
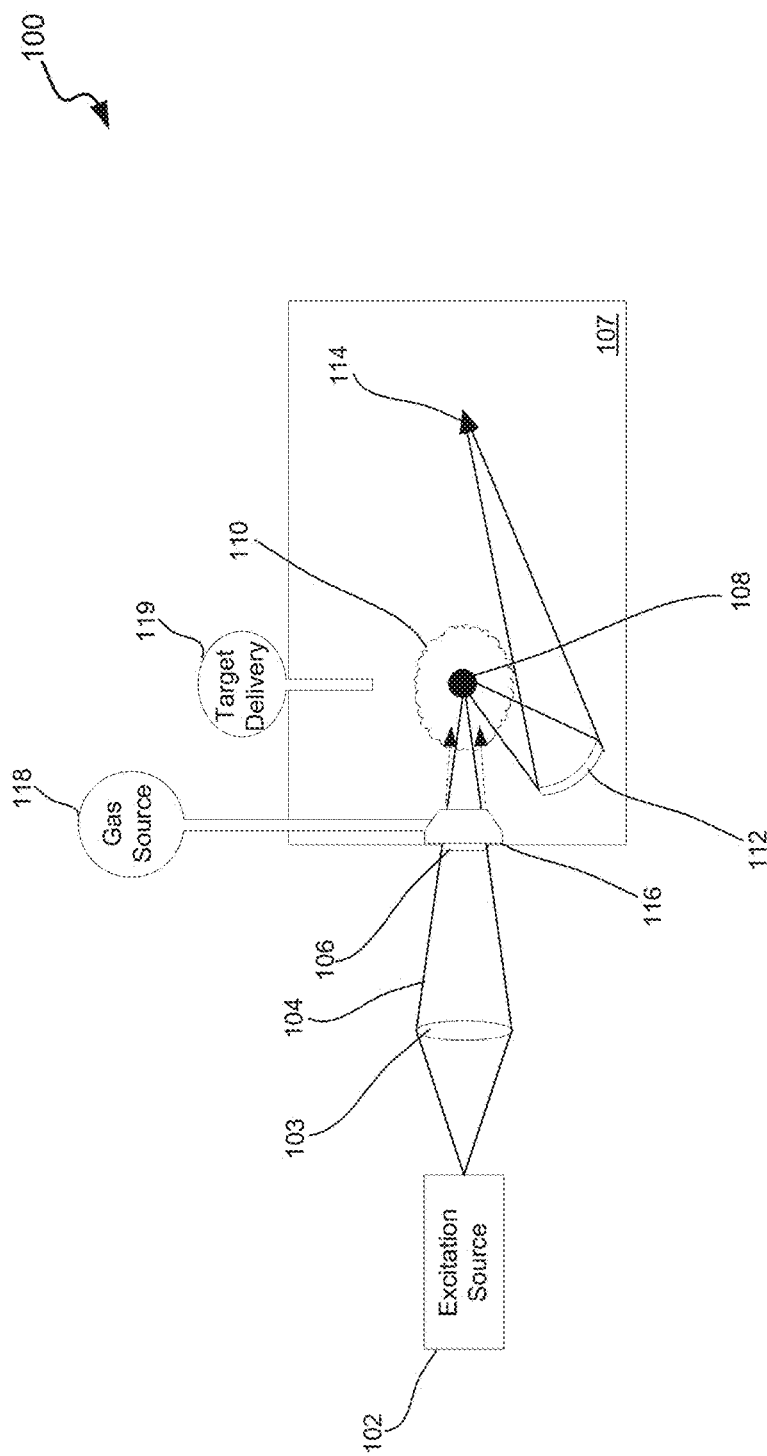
FIG. 1A is a diagrammatic representation of a plasma-based illumination source system with a debris mitigation mechanism in accordance with one embodiment of the present invention.

FIG. 1A is a diagrammatic representation of a plasma-based illumination source system 100 with a debris mitigation mechanism in accordance with one embodiment of the present invention. By way of example, the illumination source system may utilize laser-produced plasma soft x-ray, EUV, or VUV illumination source. As shown, the illumination source system may include one or more excitation sources 102, such as a drive laser, arranged to irradiate a target material 108 with beam 104. Alternatively, in a discharge-produced plasma source (not shown), the excitation source may include, but is not limited to, coils configured to magnetically excite the target material. In an embodiment, the excitation source 102 is configured to irradiate the target material 108 with a beam of illumination or a train of light pulses (e.g., 104) delivered into a cavity defined by a vacuum chamber 107. The illumination 104 emanating from the excitation source 102 may be directed through an entrance window 106 of the vacuum chamber 107.

During operation of a plasma-based illumination source system, debris such as atomic vapor, micro-particles, or contaminants (e.g. hydrocarbons or organics) may be emitted from various sources including, but not limited to, the target material, plasma site, plasma-facing components, eroded surfaces in proximity of the target material or the plasma, a target-forming structure, and/or any other structure within a plasma-based illumination source system. Debris can sometimes reach the reflective optical elements and degrade their performance or cause irreparable damage.

Contamination of the laser input window or other optical elements not only leads to reduction of the laser energy due to loss of transmission, but also degrades the laser beam quality and ability to focus, resulting in lower EUV output and distorted EUV source beam shape.

Some methods of protecting the reflective optic include deflection of debris by magnetic fields, removal by chemical etchants, or stopping by debris vanes or shields that are configured to allow soft x-ray, EUV, or VUV light to go through while capturing the atomic condensable vapor, and a gas buffer region that is generated between the target and the collector or laser window. Each of the foregoing methods has some drawbacks, as outlined below.

Chemical etchants can be used to clean accumulated byproducts from an optical surface. However, the etching process may corrode the chamber over time and is expensive. Additional heating of the optical surface may lead to thermally induced focus shift and degradation of the laser beam quality.

Coils producing magnetic fields have significant design complexity, are expensive, and work well only for deflecting ions, while not being effective for stopping neutrals (and neutral particles), which are produced when ions undergo charge exchange with the buffer gas.

Debris vanes lead to transmission light loss due to occlusion, require complicated alignment procedures, and any material that ends up condensing on the surface of the debris vanes can be a subject of secondary erosion or sputtering due to high energy ions produced by the source.

A gas buffer region located between the target and the collector slows down high-energy ions and neutrals but is not as effective at suppressing diffusion of atomic vapor and micro-particles. Buffer gas can provide some protection from small size condensable atomic clusters due to diffusion. However, long interaction length and/or high pressure are required to achieve reasonable debris mitigation efficiency. These requirements, in turn, will lead to increased transmission loss.

In order to protect the window and/or other optical elements in a plasma-based source chamber from contaminants, certain embodiments of the present invention provide directional gas flow so as to protect against debris. In general, a gas protection system provides a directional and localized protective gas flow at a relatively high velocity that can push away debris particles or clusters. The protective gas can be comprised of a gas having low absorption characteristics at 13.5 nm, such as Argon, to thereby allow efficient light transmission. Certain embodiments of the present invention can also provide mechanisms to prevent undesirable condensation of the gas jets as they exit through multiple nozzles or tubes into the chamber. The terms "tubes" and "nozzles" are used interchangeably herein. Although the following embodiments are described with respect to EUV plasma-based systems, these embodiments are applicable to other types of plasma-based illumination source systems.

Suitable excitation sources may include a pulsed laser device, such as a solid state laser, e.g., having a fiber, rod or disk shaped active media, Yb:YAG (Ytterbium doped YAG) with a wavelength of 1030 nm or Nd:YAG (neodymium-doped YAG) with a wavelength of 1064 nm and others with center wavelength around 1 μm, a MOPA configured excimer laser system, an excimer laser having one or more chambers, e.g., an oscillator chamber and one or more amplifying chambers (with the amplifying chambers in parallel or in series), a master oscillator/power oscillator (MOPO) arrangement, a master oscillator/power ring amplifier (MOPRA) arrangement, a power oscillator/power amplifier (POPA) arrangement, or a solid state laser that seeds one or more excimer or molecular fluorine amplifier or oscillator chambers. In other examples, the system may employ a pulsed gas discharge $CO_2$ laser device producing radiation at 9.3 μm or 10.6 μm, e.g., with DC or RF excitation, operating at relatively high power, e.g., 10 kW or higher and high pulse repetition rate, e.g., 50 kHz or more. In one particular implementation (for example, in a lithographic system application), the laser may be an axial-flow RF-pumped $CO_2$ laser having a MOPA configuration with multiple stages of amplification and having a seed pulse that is initiated by a Q-switched Master Oscillator (MO) with low energy and high repetition rate, e.g., 100 kHz or more. From the MO, the laser pulse may then be amplified, shaped, and/or focused before reaching the irradiation region. Continuously pumped $CO_2$ amplifiers may also be used. Depending on the application, an excimer or molecular fluorine laser operating at high power and high pulse repetition rate may also be utilized. Other designs are possible.

In some embodiments, the target material 108 is deposited via a target material delivery system 119, which may be configured to deliver droplets of the target material 108 into the chamber 107 to an irradiation region where the droplets will interact with illumination 102 from the excitation source 102 to ultimately produce a plasma 110 and generate a soft x-ray, EUV, or VUV emission that is collected and focused by a collector element 112 to an intermediate focus point 114. Alternatively, the collector optic may include an aperture (not shown) configured to allow illumination from the excitation source 102 to pass through and reach the target material 108 deposited within the irradiation region of the cavity 107. The reflected light may then be directed by any suitable collection side optics (not shown) from the chamber 107.

The collector optic 112 may include a grazing-incidence mirror or a near-normal incidence collector mirror having a reflective surface in the form of a prolate spheroid (e.g., an ellipse rotated about its major axis), which may include a graded multi-layer coating with alternating layers of molybdenum and silicon, and in some cases one or more high temperature diffusion barrier layers, smoothing layers, capping layers and/or etch stop layers. In some embodiments, the reflective surface of the collector optic has a surface area in the range of approximately 100 and 10,000 $cm^2$ and may be disposed approximately 0.1 to 2.5 meters from the target material 102 or irradiation region. Those skilled in the art will appreciate that the foregoing ranges are exemplary and that various optics may be used in place of, or in addition to, the prolate spheroid mirror for collecting and directing light to an intermediate location for subsequent delivery to a device utilizing EUV/VUV illumination, such as an inspection system or a photolithography system.

Figure 1B:
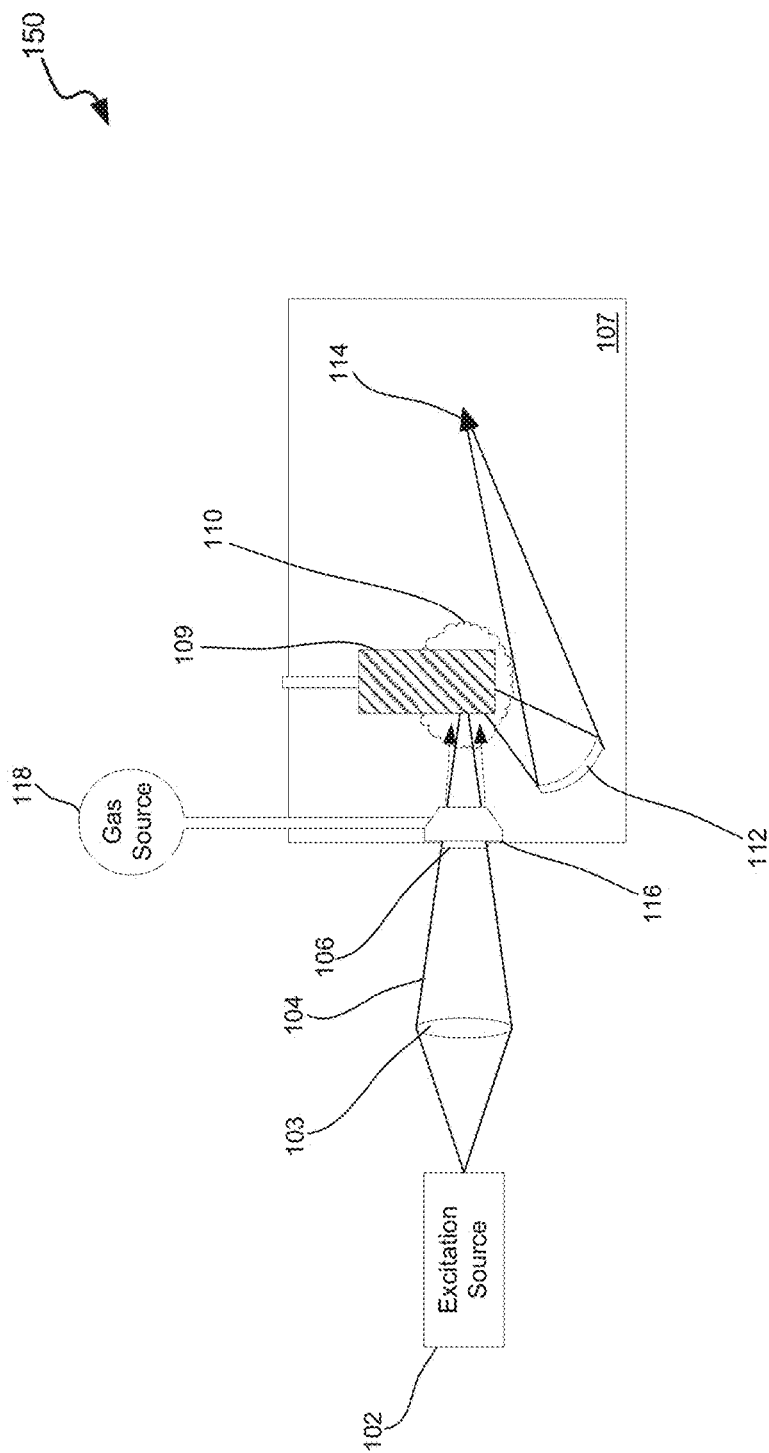
FIG. 1B is a diagrammatic representation of a plasma-based illumination source system with a debris mitigation mechanism in accordance with an alternative embodiment of the present invention.

The target material 108 may include, but is not necessarily limited to, a material that includes tin, lithium, xenon or combinations thereof. In some embodiments, the target material 108 is delivered in the form of liquid droplets, solid pellets, and/or solid particles contained within liquid droplets. Alternative targets or target-forming structures may be utilized, such as a drum 109 as shown in the alternative illumination source system 150 of FIG. 1B, which may be cooled cryogenically, or utilizing a cold finger. In an embodiment, the cooled drum 109 may be coated with xenon ice. Those skilled in the art will appreciate that various target materials and deposition techniques may be used without departing from the scope of this disclosure.

The illumination source system 100 may also include a protection system for protecting plasma-facing optical elements in the chamber 107 from plasma-generated debris using high speed directional gas flow. Examples of plasma-facing optical elements may include laser entrance window 106, collector elements, metrology windows, filters, deflectors, mirrors, etc. In one implementation, gas is flowed through small holes in nozzles or tubes positioned around the optical component with such flowing gas serving to push away the debris away from the plasma-facing optical element.

The gas flow can have longitudinal and transverse components with respect to the one or more debris paths. Longitudinal gas flow has flow direction opposite to the velocity of debris. CFD (computational fluid dynamics) modeling shows that high-speed longitudinal gas flow directed towards the source of the debris is more effective than a stationary buffer gas. Furthermore, simulation results show that gas flow with counter-directional velocity with amplitude comparable to the velocity of micro-particles (~100 m/s) efficiently stops contaminants. In the first approximation effectiveness of laser window protection from the atomic vapor deposition can be estimated by calculating the dimensionless Peclet number defined as the ratio of advection of the vapor by the flow to the rate of diffusion, Pe=vL/D, where v is the gas flow, L is the characteristic length, and D is the diffusion coefficient of vapor material in the gas. Then, the vapor attenuation factor is equal to exp(-Pe). Taking Aluminum atomic vapor at room temperature diffusing against the Argon flow also at room temperature, one can estimate the Diffusion coefficient D to be 0.49 m$^2$/s and the Argon flow required for achieving Pe=4 is ~0.7 slm. Depending on the desired degree of vapor attenuation, the gas flow for achieving this Peclet number for particular operational conditions can then be determined. For example, a Peclet number, Pe, that is equal to or greater than 4 would provide more than 50 times vapor attenuation. Then, assuming, for example, that argon gas is flown through a gas cone of 80 cm$^2$ opening area, the flow uniformly expands at an angle α=45° after passing through the gas cone and reaches average pressure of 30 mTorr, which occupies the length L=10 cm. Taking Aluminum atomic vapor at room temperature diffusing against the argon flow, one can estimate that Argon flow for achieving Pe=4 is ~0.7 slm.

In certain examples, the debris protection system is designed to flow gas out of a plurality of nozzles and away from the optical element at a velocity towards the plasma so as to prevent debris from reaching such optical element resulting in a Peclet number averaged over a protected area of the optical element that is greater than or equal to 2 In other examples, the design achieves a Peclet number that is equal to or greater than 4.

The gas may be selected to be transmissive with respect to the light that is generated by the plasma. In a EUV application, a gas with high EUV transmission characteristics includes, but is not limited to, Argon, Hydrogen, He, Br$_2$, HBr, N$_2$ or their mixtures.

In one implementation, debris protection is achieved by positioning small gas nozzles adjacent to the chamber window. These nozzles can be arranged and sized to generate directed gas flows with low divergence, high density, and high speed over a short distance. Additionally, a combination of different geometries (e.g., circular holes, oval, etc.) or gas flow shapes (planar gas curtain, ring-shaped jet, etc.) can be implemented.

There may be any suitable number of nozzles, and such nozzles may be distributed in any suitable manner. For instance, the nozzles may be evenly distributed or have a higher density in areas of the chamber that are predicted to have more debris presence.

Gas may be flowed from a gas source (e.g., 118) via a manifold to a plurality of nozzles. That is, the gas source, manifold, and nozzles are fluidly coupled. The manifold may have any suitable shape and size and be comprised of one or more cavities, channels, or any other structure or combination of structures defining one or more independent or shared gas flow pathways.

In the illustrated example, the illumination source system 100 includes a gas injection system 116 that provides protective gas injection, one end of this gas injection system 116 can be adjacent to the entrance window 106 (as shown). The gas injection system 116 can be configured to also enclose the entrance window.

Figure 2A:
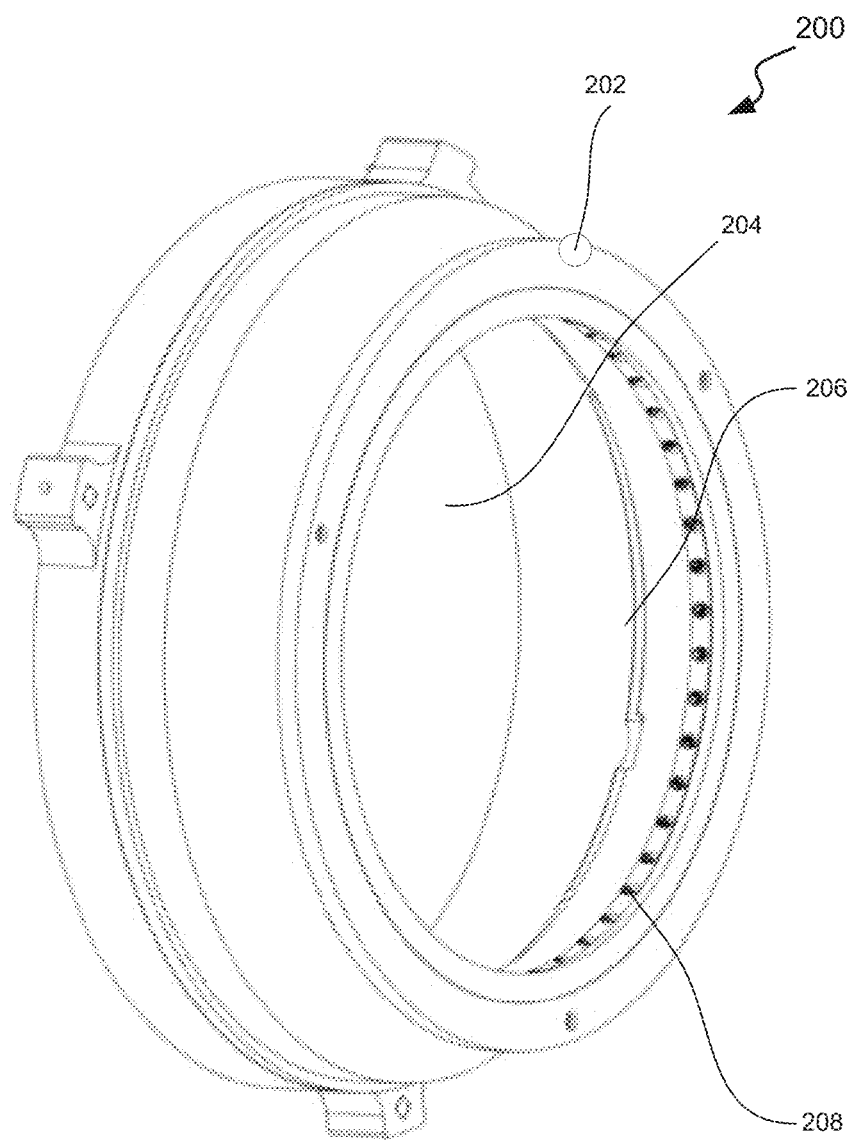
FIG. 2A is a perspective view of a gas injection system in accordance with a specific implementation of the present invention.
Figure 2B:
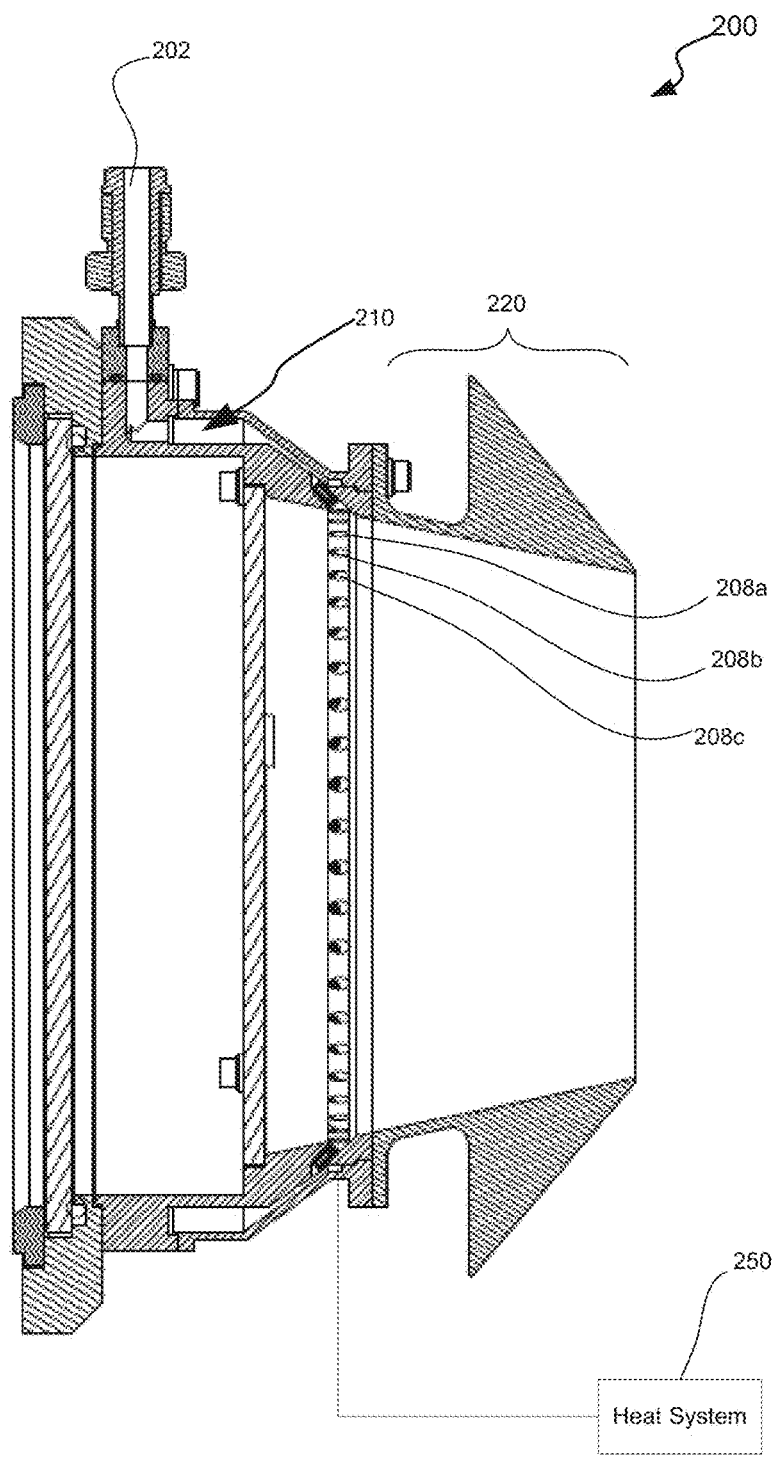
FIG. 2B is a side view perspective of the gas injection system of FIG. 2A.

FIG. 2A is a perspective view of a gas injection system 200 in accordance with a specific implementation of the present invention. FIG. 2B is a side view perspective of the gas injection system of FIG. 2A. As shown in FIG. 2A, a plurality of gas nozzles 208 are positioned in front of entrance window 204 to flow gas away from the entrance window 204. The gas injection system 200 may also include a cone or other gas-directing structure (220 of FIG. 2B).

A replaceable protective glass (or transparent material) plate or pellicle 206 may be mounted between the laser entrance window 204 and plasma source in the laser beam path for intercepting particulates and protecting the surfaces of entrance window against all forms of contaminants. In this and other embodiments, the directional gas flow can be used to protect the pellicle. In one embodiment, the side of the pellicle facing the plasma may be uncoated to avoid any damage or delamination of an anti-reflective (AR) coating by the debris, while the side away from the plasma can be AR coated to improve the transmission. In other embodiments, the pellicle is replaceable with a new one without having to open the vacuum chamber. For example, a replacement pellicle may be rotated into a position to replace the original pellicle.

The gas injection system 200 can serve to shape the gas flow while allowing the illumination beam to propagate through the chamber 107. The gas injection system may comprise a modular design and consist of several stackable cones. As shown in FIG. 2B, the gas injection system 200 includes a manifold or gas reservoir 210 for receiving gas through inlet 202. The manifold is connected to a plurality of exit nozzles, e.g., 208a, 208b, and 208c. The gas may be delivered to the manifold via one or more inlets although only a single inlet 202 is shown.

Figure 3:
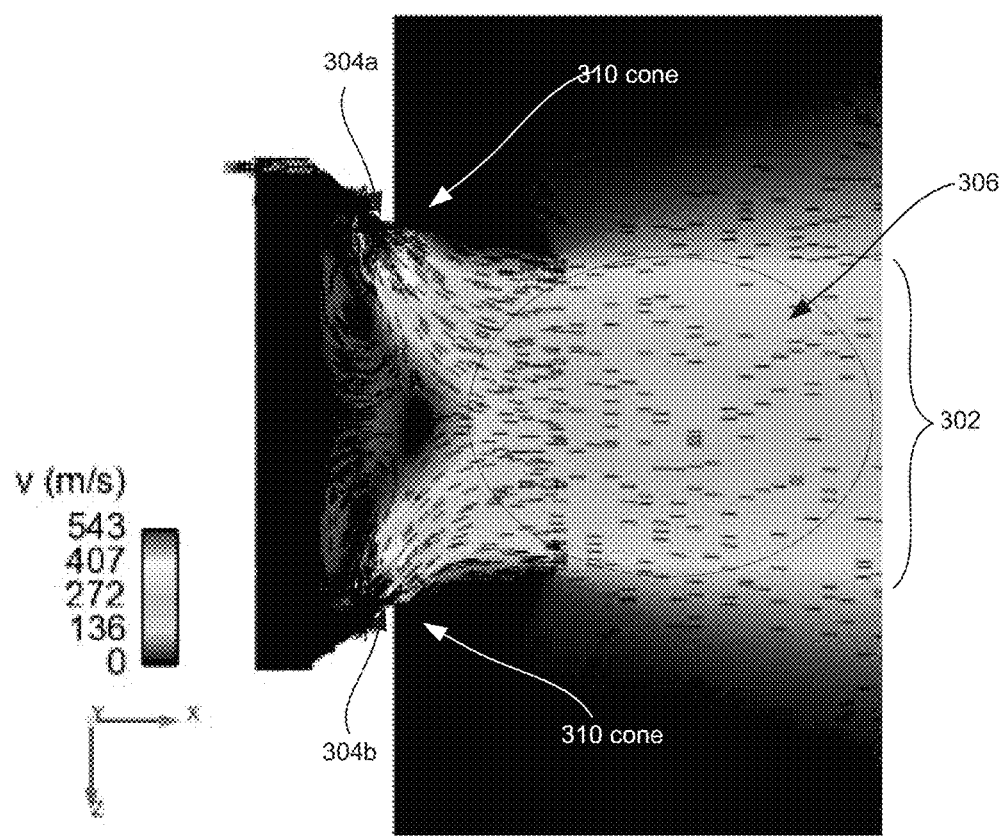
FIG. 3 illustrates a cross section of gas flow distribution through 48 gas nozzles to form a protected flow in accordance with one embodiment of the present invention.

In general, the gas can be fed into the gas injection system 200 through manifold 210 and out through the exit nozzles. The manifold 210 has higher conductance than the total conductance of all the nozzles, which allows pressure inside it to equilibrate before gas exits through the nozzles. FIG. 3 illustrates a cross section of gas flow distribution through 48 gas nozzles to form a protected flow in accordance with one embodiment of the present invention. It is noted that only two nozzles are visible in FIG. 3. For chamber portion 302, different gray scales are used to illustrate different gas velocities. As shown, the gas flow has a higher velocity immediately exiting the nozzles (e.g., input portions 304a and 304b), while having a lower velocity as the gas flows out of the cone 310 into the chamber (e.g., into area 306). Uniform distribution is due to the manifold before the nozzles, wherein flows are not shown. The gas flow is uniformly distributed among the nozzles, providing uniform protection of the entrance window and/or pellicle if present.

In certain embodiments, the entrance window and/or pellicle can be made of sapphire material. Because of its high modulus of rupture, sapphire window can be made much thinner than other common optical windows, thus minimizing the aberration of the drive laser beam. Due to its excellent thermal conductivity, beam distortion caused by temperature gradient can also be reduced. Furthermore, sapphire is also resistant to UV radiation darkening, which may be useful for an EUV light source since a large amount of out-of-band (OOB) radiation in the UV/DUV/VUV range is emitted along with the desired 13.5 nm wavelength.

When the gas expands after exiting a nozzle, the temperature of the gas flow decreases rapidly. In some cases, the temperature can become so low that gas begins to liquefy.

Nozzle flow can be changed substantially by the formation of liquid as it may alter gas velocity, temperature, and pressure. It would be beneficial to reduce condensation for applications in which the gas flow is being used to protect sensitive optical components from debris since it is the gas phase of protective gas that mitigates the debris, while the condensed phase of protective gas will do little mitigation.

To solve this condensation problem, gas pressure, number and size of nozzles can be selected to prevent or minimize condensation of the gas at each nozzle exit. Accurate prediction of gas dynamic properties throughout the flow field may be achieved based on CFD (computational fluid dynamics) modeling. With the help of CFD, design parameters can be optimized to minimize or inhibit condensation. The following general nozzle and manifold design guidelines can be used to generally inhibit or substantially minimize condensation.

When a gas flows from high to low pressure, the gas expands so that its density decreases and its volume increases. As this occurs thermal energy is converted to kinetic energy. That is, the gas gets cold as its speed becomes large. This effect can be significant when the Mach number (ratio of the gas speed to the local sound speed) of the flow becomes greater than 0.3. Large Mach numbers can be associated with injecting any significant amount of gas into a vacuum environment.

Figure 4A:
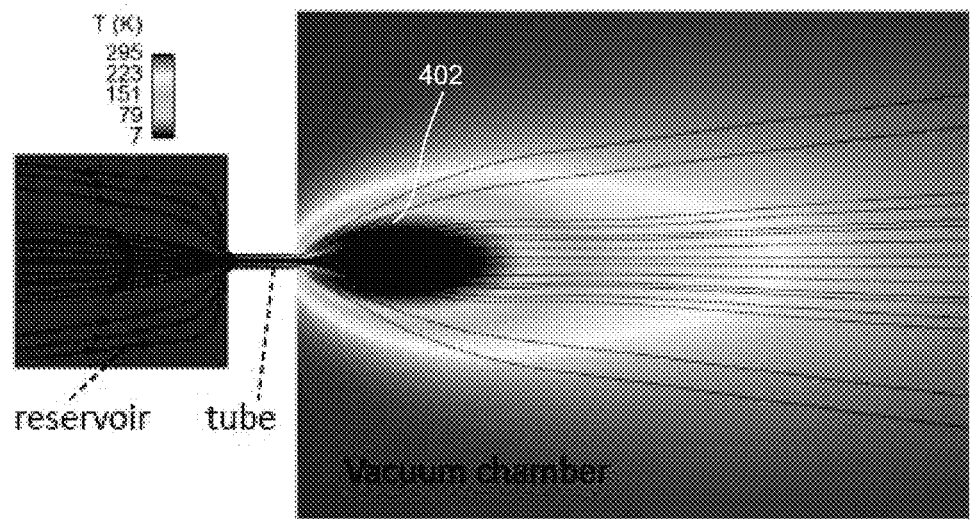
FIGS. 4A and 4B show the results of a CFD (computational fluid dynamics) simulation for flowing argon from a high-pressure reservoir, through 12 tubes, each with a diameter of 0.75 mm and length of 3.2 mm, into a low pressure vacuum chamber.
Figure 4B:
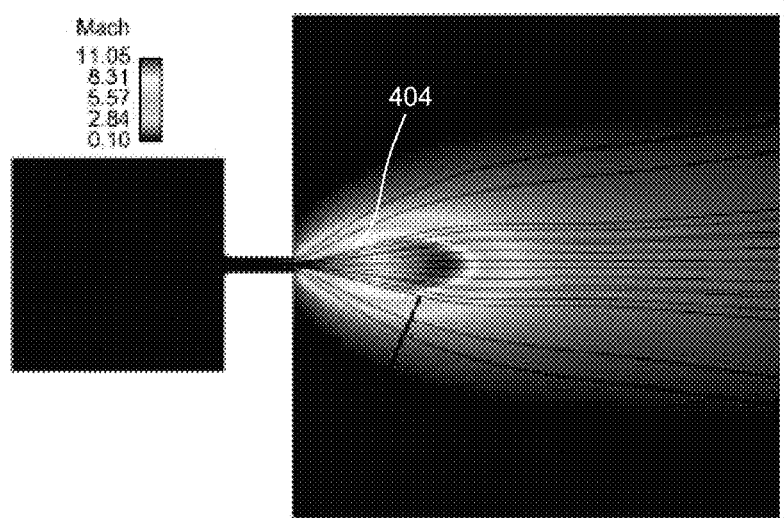

FIGS. 4A and 4B show the results of a CFD simulation for flowing argon from a high-pressure reservoir, through a tube with a diameter of 0.75 mm and length of 3.2 mm, into a vacuum chamber where the pressure is low. The pressure in the reservoir is 6149 Pa, while the pressure in the vacuum chamber is 5 Pa (1 Pa~7.5 mTorr). FIG. 4A shows the gas flow streamlines and the gas temperature, and FIG. 4B shows the Mach number. The flow is choked at the outlet of the tube, where the Mach number is unity, and the pressure is well above the vacuum chamber pressure. Such a gas flow is said to be under-expanded, meaning it is not sufficiently expanded to match the tube outlet pressure to the vacuum chamber pressure. The gas temperature in the reservoir is near a room temperature value (295 K). After the gas exits the tube, it expands and its Mach number increases to a large value. When this effect occurs, the gas gets cold. At the point of minimum temperature 402 (maximum Mach number 404), the pressure (not shown) of the gas is actually below the pressure that exists in most of the vacuum chamber. That is, the gas flow over-expands. A shock wave surrounds the region of high Mach number, and as the gas flows through that shock wave the Mach number is reduced and the temperature and pressure of the gas increase.

Figure 5:
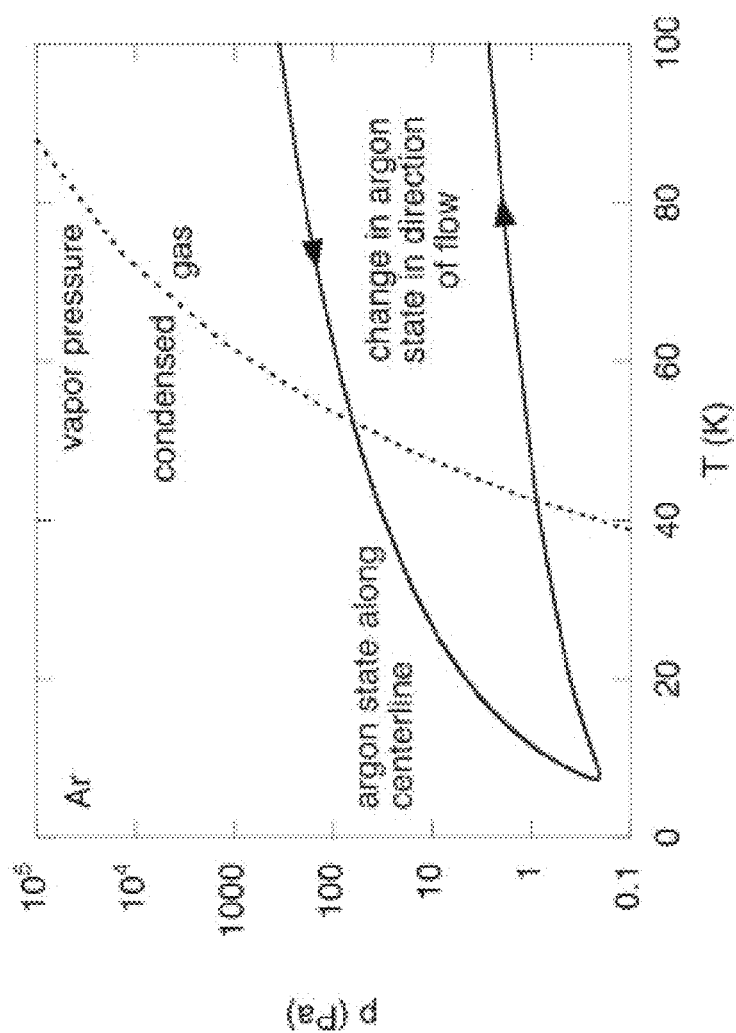
FIG. 5 shows that state of the argon, in pressure-temperature (p-T) space, for a path along the centerline of the geometry that is shown in FIGS. 4A and 4B, starting from the reservoir and ending in the vacuum chamber.

FIG. 5 shows that state of the argon, in pressure-temperature (p-T) space, for a path along the centerline of the geometry shown in FIGS. 4A and 4B, starting from the reservoir and ending in the vacuum chamber. Also shown is the vapor pressure of argon as a function of temperature, where states to the left of this curve correspond to argon in a condensed state and those to the right of this curve correspond to argon in the gaseous state. The gas starts out at 6149 Pa and 295 K, off the graph. As the gas expands its pressure and temperature decrease, the state eventually crossing over from the gaseous region to the condensed region where it reaches a minimum pressure and temperature of 0.2 Pa and 7.3 K. As the argon continues to flow from there, its pressure and temperature begin to increase, eventually crossing back over into the gaseous region. The actual condensation process is not included in this simulation, but condensation is likely to occur where FIG. 5 shows argon states in the condensed region. Once condensation has occurred, the gas is likely to stay condensed for a while even after crossing back over into the gaseous region. For instance, it may take a while for the condensed argon to equilibrate with its environment.

Several protection system designs may be used to prevent condensation. First, the gas pressure in the reservoir can be reduced. All else being equal, a pressure reduction will decrease the rate of gas flow. In order to preserve the total rate of gas flow, the reduction in reservoir pressure can be combined with an increase in the number of tubes (nozzles) connecting the reservoir and vacuum chamber. Alternatively or additionally, the reduction in reservoir pressure can be combined with an increase in the diameter of the tube(s). Either way, reducing the reservoir pressure results in a decrease in the maximum Mach number that the gas will reach and an increase in the minimum temperature. The reduction in pressure that is achieved depends on a number of factors, including the tube count, tube diameter, tube length, gas flow, etc. For example, as the tube diameter increases, there will be a larger reduction in reservoir pressure because the size of the large Mach number region and the maximum Mach number both increase with tube diameter.

As discussed above, there is a shock wave that surrounds the high Mach number region downstream of the tube, and this shock wave results in an increase in temperature when the gas flows through such tube. This effect can be used to prevent condensation if the shock wave can be induced to occur early in the gas flow.

Any suitable mechanism may be used to induce the shock wave to occur early in the gas flow. In a first implementation, the protection system geometry can include one or more intermediate regions, or expansion stages, between the tube and the vacuum chamber. For instance, the protection system can include an intermediate stage that has a diameter larger than that of the tube, but smaller than the vacuum chamber. Examples are described further below.

In a second implementation, a baffle plate can be placed downstream of the tube outlet. The diameter and length of the intermediate stage, and the diameter and distance from the tube outlet of the baffle, that may be required to prevent or minimize condensation depend on the reservoir pressure and tube diameter.

In another embodiment, the tubes or nozzles may be heated. Heat transfer from the tube wall increases the temperature of the gas as it flows through the tube. Although the gas will expand and cool upon exiting the tube, condensation can be avoided if the gas temperature is sufficiently high at the outlet. Even with a room temperature tube, some heat transfer to the gas will occur as it flows through the tube and expands. But this heat transfer is limited because most of the gas expansion, which results in gas cooling that drives the heat transfer, occurs near the outlet of the tube. So regardless of the length of the tube, the heat transfer to the gas will be near zero over the majority of the leading part of it. However, by heating the tube to a large temperature, heat transfer can then occur over the entire length. The tube temperature and its length can be selected to prevent condensation, depending on the tube diameter and reservoir pressure.

In the following, results are presented of detailed CFD simulations carried out to determine specific designs for preventing condensation, each based on one of the design considerations described above. For the purposes of these specific examples, the gas is assumed to be Argon; the total flow rate is assumed to be 2 slm (standard liters per minute); and the vacuum chamber is assumed to have a pressure of 5

Pa. In each case, the simulations are compared to an initial design based on 12 tubes, each with a diameter of 0.75 mm and a length of 3.2 mm, such that the flow rate through each tube is 0.167 slm. These conditions correspond to the results presented in FIGS. 4A, 4B, and 5 as discussed above, and result in a prediction that condensation will occur.

Figure 6A:
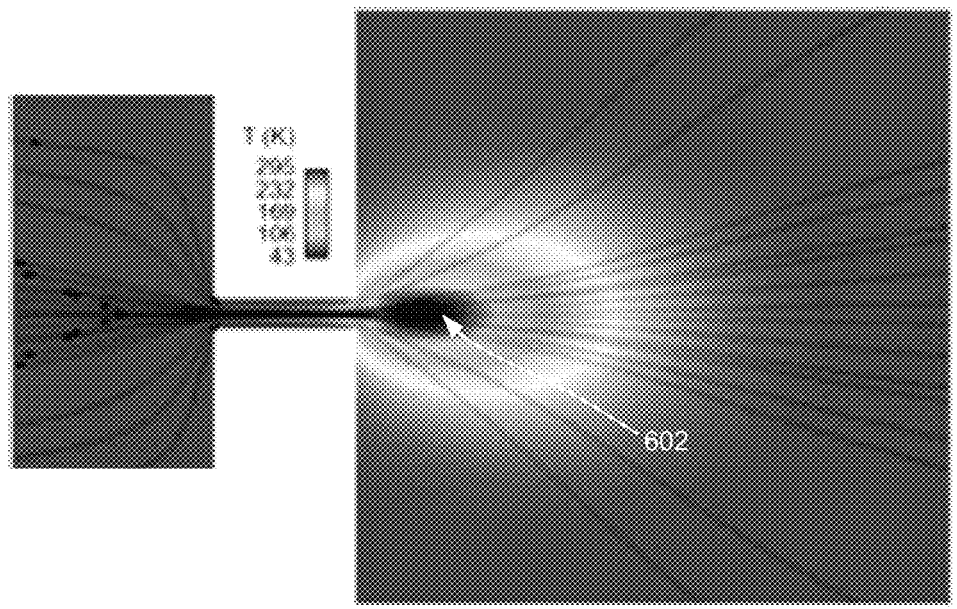
FIGS. 6A and 6B show the results of a CFD simulation for a debris protection system having an increase in nozzle count from 12 to 60.
Figure 6B:
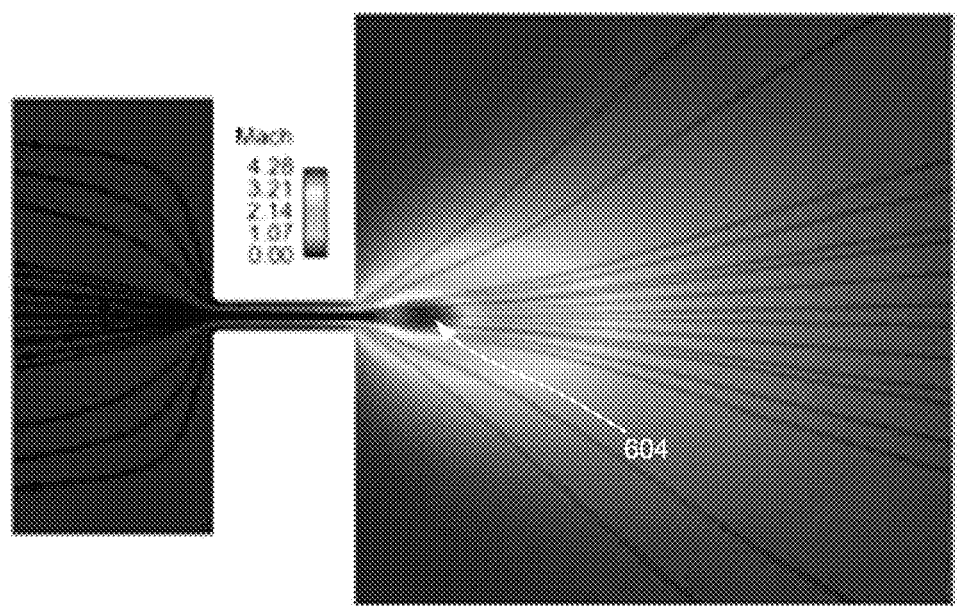

One method of preventing condensation is to increase the number of tubes. For instance, the number of tubes may be increased from 12 to 60. This increased tube count reduces the reservoir pressure to 1616 Pa. FIGS. 6A and 6B shows the results of the simulation for this case. By dividing the total flow over 60 tubes, the flow rate through each tube is only 0.0333 slm. The region of large Mach number (604) as shown in FIG. 6B and the region of small temperature (602) as shown in FIG. 6A are much smaller, as compared with FIGS. 4B and 4A.

Figure 7:
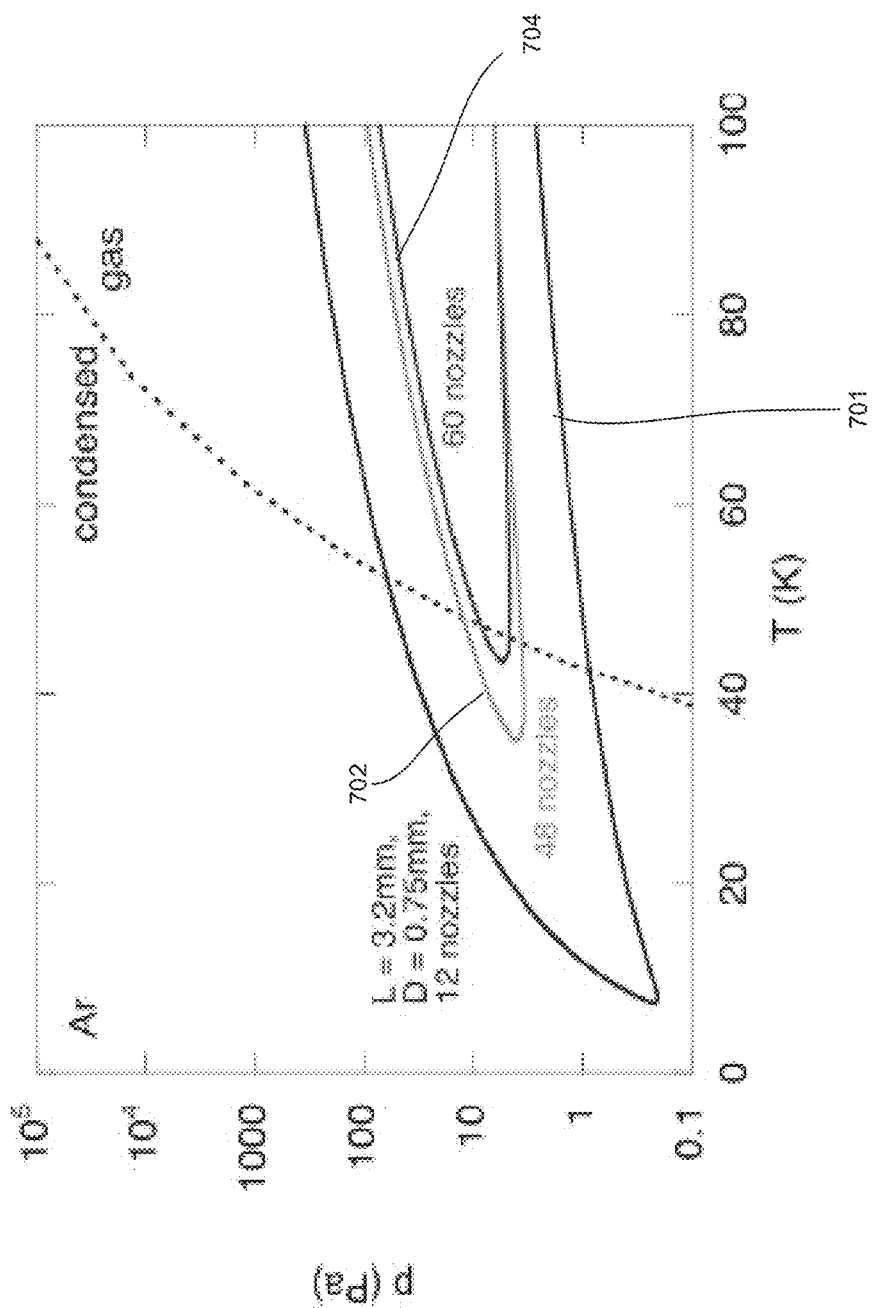
FIG. 7 shows the state of an argon flow in p-T space for a debris protection system having 12, 48 and 60 tubes.

FIG. 7 shows the state of the argon flow in p-T space for 12 tubes (701), 48 tubes (702), and 60 tubes (704). The result for 12 tubes is the same as that presented in FIG. 5. The result for 48 tubes (702) is an improvement over the 12-tube result in that the minimum temperature reached is larger, but it still crosses over into the condensed region. The result for 60 tubes (704) is probably sufficient to prevent condensation, but one can add few more tubes to definitely ensure this.

Condensation can be prevented by increasing the tube diameter, while maintaining a lower tube count. For example, the tube diameter can be increased from 0.75 mm to 3.5 mm, while maintaining a total of 12 tubes. This specific diameter increase will result in a reduction in the reservoir pressure from 6149 to 272 Pa. Note that this reservoir pressure is much smaller than that obtained by increasing the number of tubes to 60 (1616 Pa), as discussed above. This shows that the reservoir pressure alone does not determine the likelihood for condensation. That is, the tube diameter also plays a role.

Figure 8:
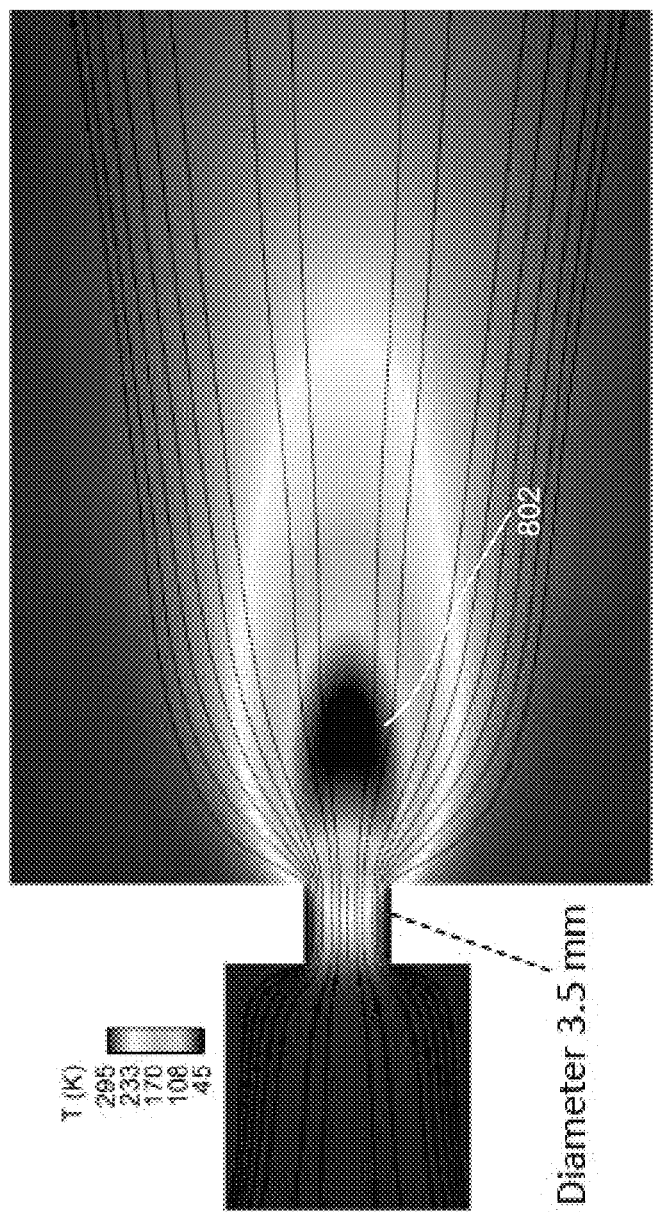
FIG. 8 shows the results of a CFD simulation for a debris protection system having an increased tube diameter of 3.5 mm.
Figure 9:
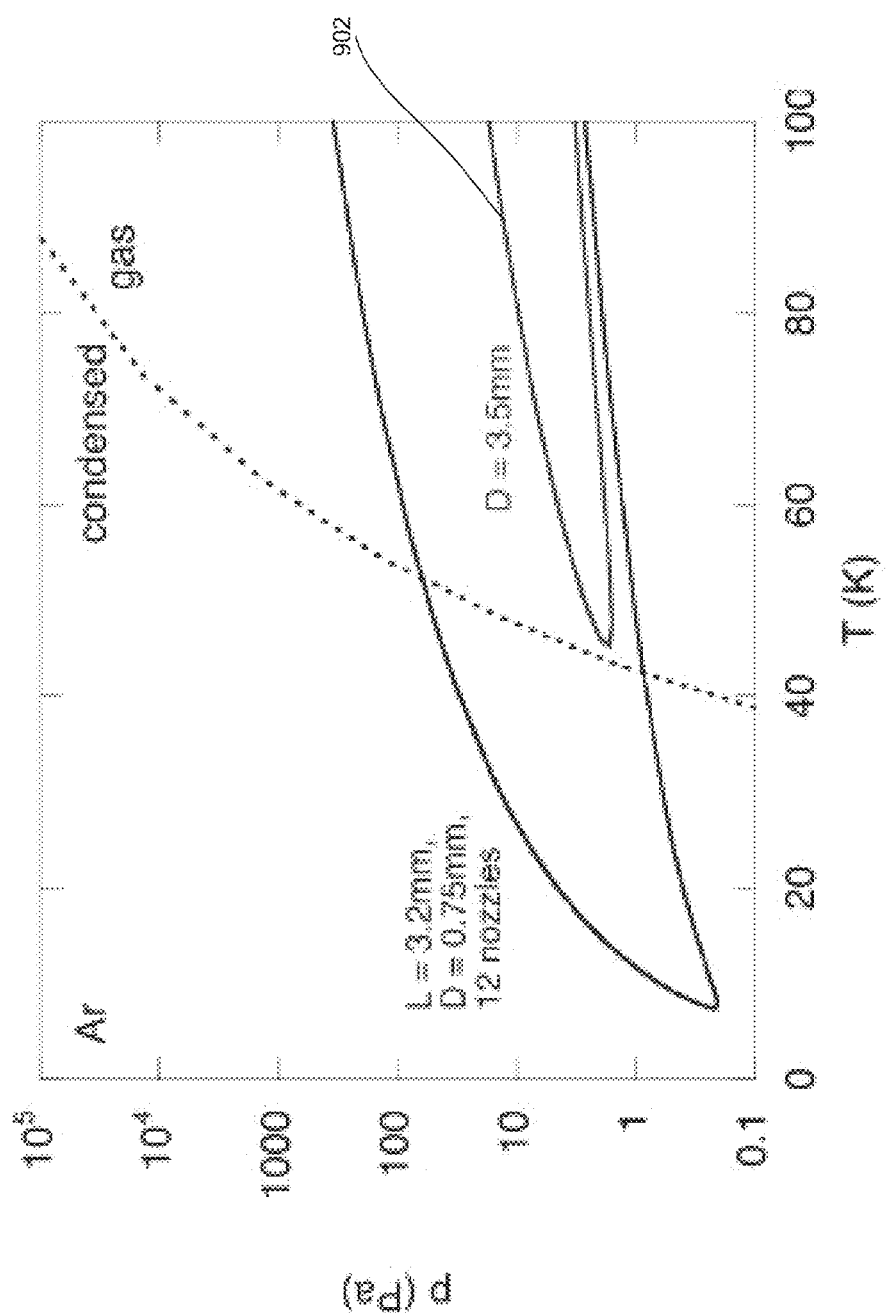
FIG. 9 shows the state of an argon flow in p-T space for a debris protection system having a tube diameter of 3.5 mm.

As the tube diameter increases, the size and magnitude of the large Mach number region increases, and consequently the temperature decreases, all else being equal. As the tube diameter is increased, the reservoir pressure decreases. However, the beneficial effects of the latter may be partially offset by the unfavorable effects of the former. As a result, increasing the tube diameter by a factor of at least 4.7 has been predicted to work well. FIG. 8 shows simulation results for increasing the tube diameter. As shown, the size of the region of small temperature (802) is relatively small. If not for the large reduction in reservoir pressure, the size of the region of small temperature would be much larger, and the temperature within that region would be much smaller. FIG. 9 shows that the argon remains safely in the gaseous region for a tube diameter of 3.5 mm (902).

Figure 10A:
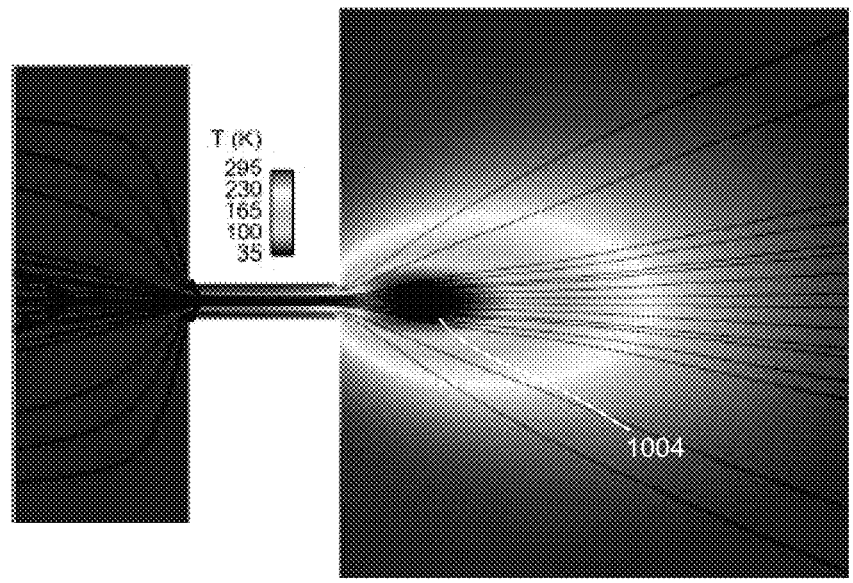
FIG. 10A shows the result of a CFD simulation for a debris protection system having 48 tubes.
Figure 10B:
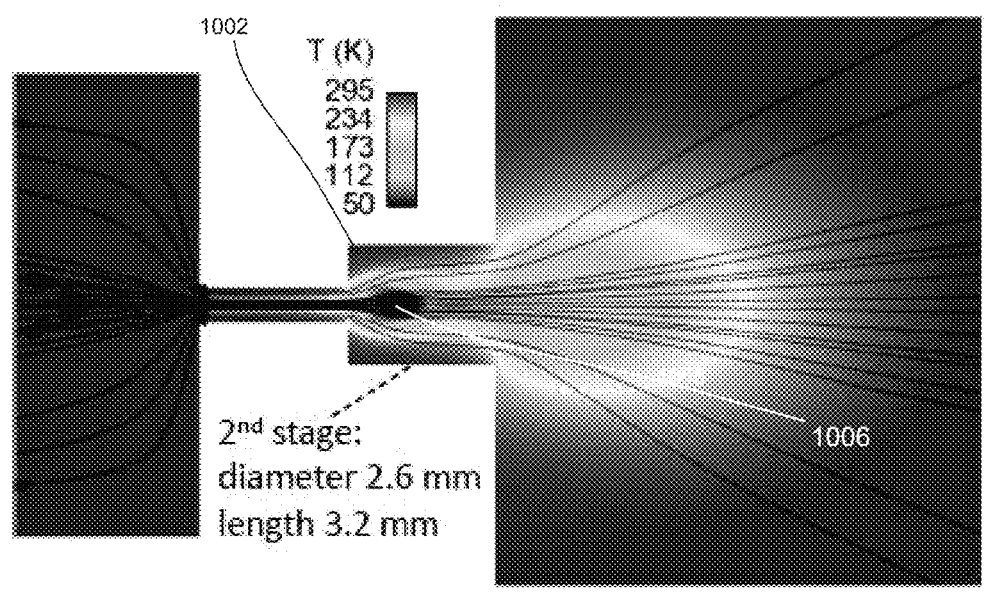
FIG. 10B shows the result of a CFD simulation for a debris protection system having 48 tubes and an intermediate stage.

As discussed above for the effect of increasing the number of tubes, 48 tubes was not sufficient to prevent the argon from entering the condensed region in p-T space (see FIG. 7). However, by adding an intermediate stage to the geometry the expansion process can be altered such that condensation can be prevented. FIG. 10A shows the result of a CFD simulation for 48 tubes, and FIG. 10B shows the same case except with a second stage 1002 added to the geometry. In this embodiment, the second stage 1002 is located downstream of the tube, and it has a diameter of 2.6 mm and a length of 3.2 mm. FIG. 10B shows that the size of the small temperature region (1006) immediately downstream of the tube is much smaller than the small temperature region (1004) in FIG. 10A.

Figure 11:
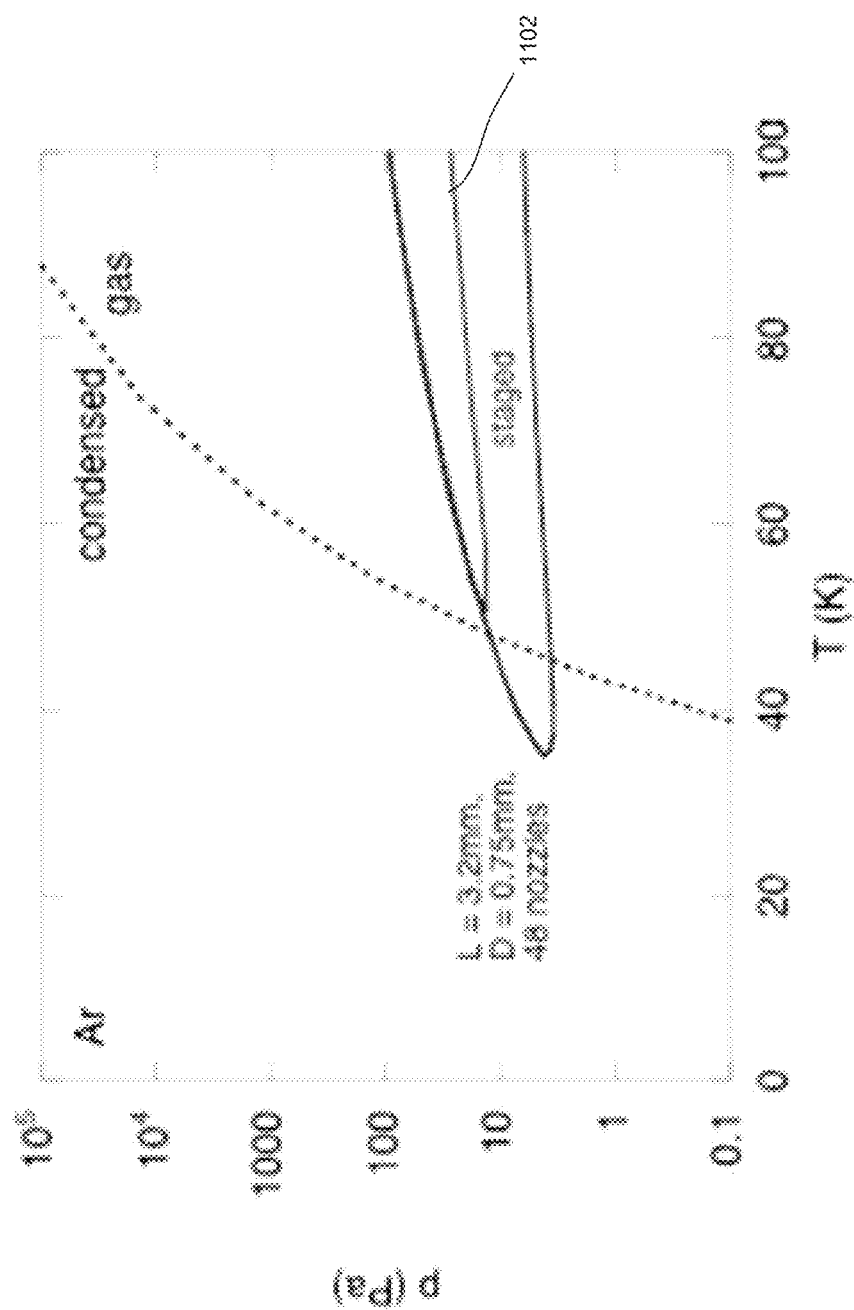
FIG. 11 shows the effect of a second stage on the state of an argon flow in p-T space.

The intermediate stage can serve to constrict the gas expansion process, resulting in an elevated pressure there that is significantly larger than what occurs without the second stage. This elevated pressure causes the shockwave to occur much sooner in the gas flow than what otherwise occurs. That shockwave reduces the size of the small temperature region and increases the minimum temperature within it. Beyond the second stage the gas expands again and creates a second region of reduced temperature, but it is a minor reduction compared to the first small temperature region. FIG. 11 shows the effect of the second stage on the state of the argon flow in p-T space (1102). As can be seen, there is no concern for condensation in the design with the second stage.

Figure 12:
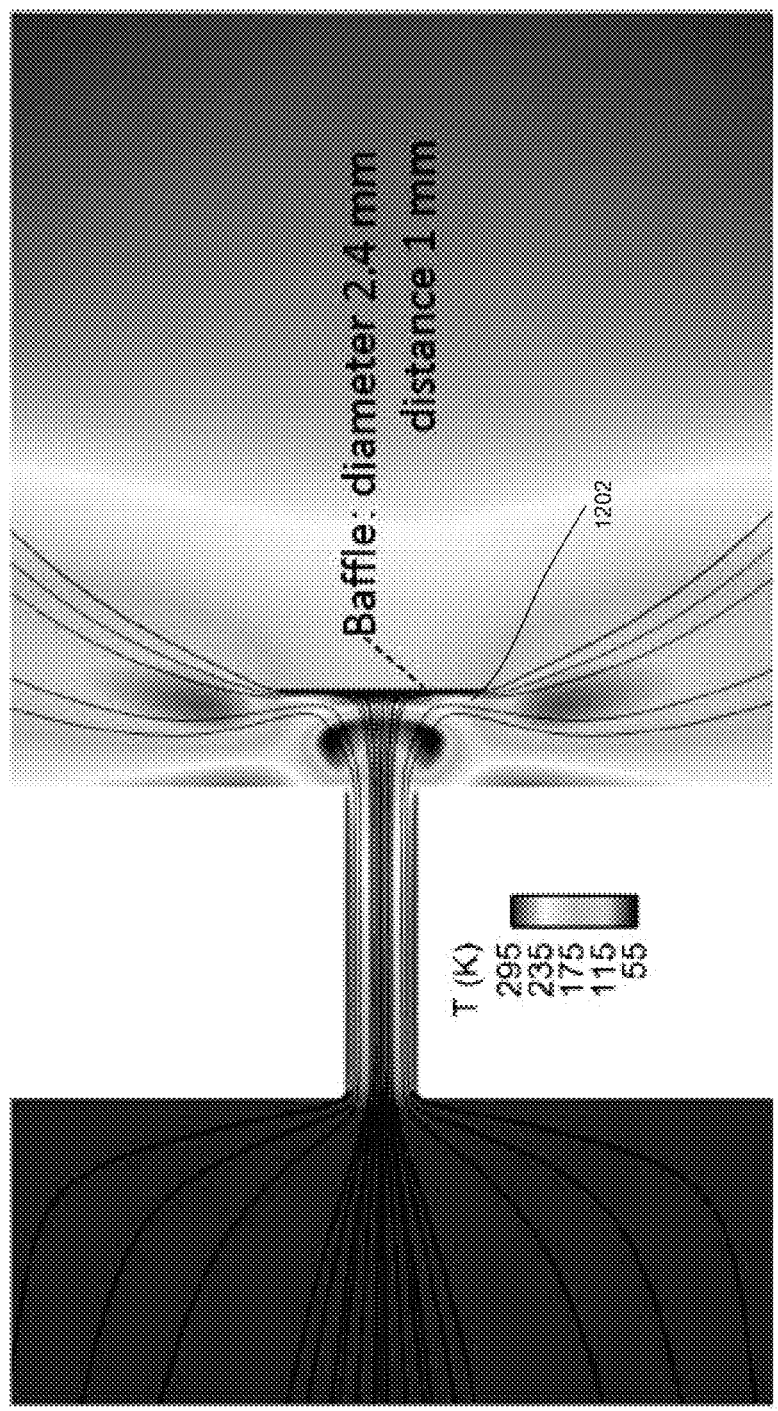
FIG. 12 shows the results of a CFD simulation for a design having a baffle plate with a diameter of 2.4 mm and located 1 mm downstream of the tube outlet.
Figure 13:
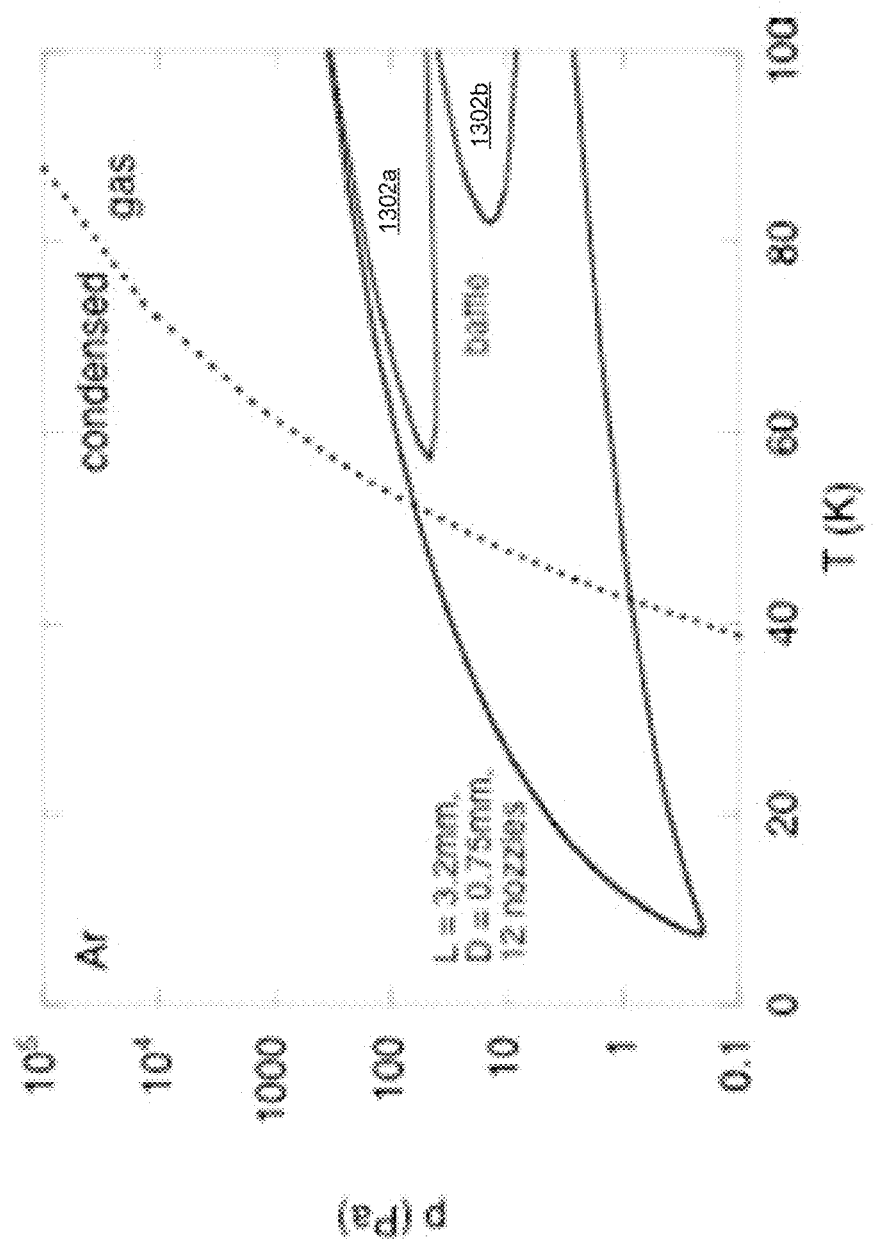
FIG. 13 shows the effect of using a baffle plate on the argon state in p-T space.

Another way to induce a shockwave in a flow is to add a baffle plate that is perpendicular to the primary gas flow direction. FIG. 12 shows the results of a CFD simulation for a debris protection system having a baffle plate (1202) with a diameter of 2.4 mm and located 1 mm downstream of the tube outlet. The gas exits the tube and impinges upon the baffle plate 1202, which forces the flow to spread out radially in order to flow into the vacuum chamber. As in the design discussed above with a second stage, there are two regions that have locally small temperature, one before the baffle plate and another near the perimeter of the baffle plate In this design, the baffle plate is placed sufficiently close to the outlet of the tube to induce the shockwave soon enough in the flow to limit the decrease in temperature in that first region. FIG. 13 shows the effect of the baffle plate on the argon state in p-T space (1302a and 1302b). As can be seen, there is no concern for condensation with the baffle plate.

Figure 14:
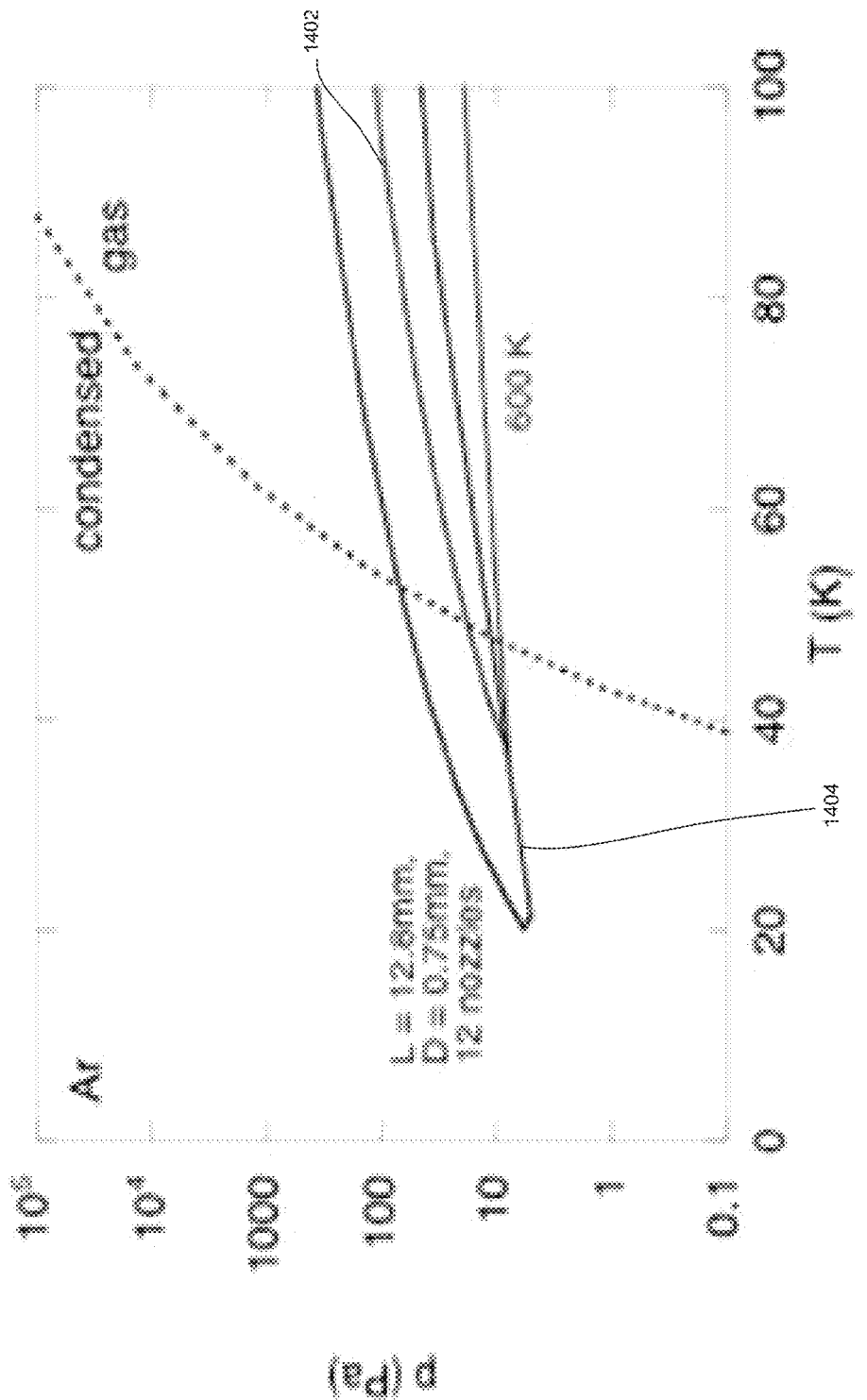
FIG. 14 shows the effect of tube temperature on the state of the argon.

The debris protection system may also include a mechanism for preventing condensation by heating the tube such that it has an elevated temperature. In one example, the tube temperature was set to 600 K and the tube length was increased to 12.8 mm. FIG. 14 shows the effect of tube temperature on the state of the argon. Two curves are shown, where both correspond to a design having a tube length of 12.8 mm, a tube diameter of 0.75 mm, and a flow rate corresponding to 12 tubes total (0.167 slm). The trajectory curve 1402 corresponds to a 600 K temperature, while curve 1404 corresponds to a room temperature. The result for the 600 K tube is better in terms of a larger minimum temperature.

A debris protection system may also incorporate a heating system, such as 250 of FIG. 2B, that is coupled to the tubes or nozzles. One can potentially use tube heating in combination with other techniques discussed above to avoid condensation.

The above-described techniques and apparatus for preventing gas condensation can be used in different systems in which gas is injected through a nozzle or a combination of nozzles (or tubes). For example, the condensation prevention mechanisms can be used or integrated with the showerhead collector as further described in U.S. Patent Application 2014/0306115, filed on 7 Apr. 2014 by Alexey Kuritsyn, et al., which application is incorporated herein by reference in its entirety.

Compared to protection schemes using an electric or magnetic field, certain embodiments of the present invention provide protection from both neutral and charged particles. In addition, high-speed directional gas injection provides more effective debris suppression compared to protection method using stationary purge gas. Additionally, certain embodiments of the present invention improve the efficiency of debris mitigation by utilizing directional gas flow and significantly extend the lifetime of laser entrance window and other optical elements, thus significantly improving optics lifetime.

Figure 15:
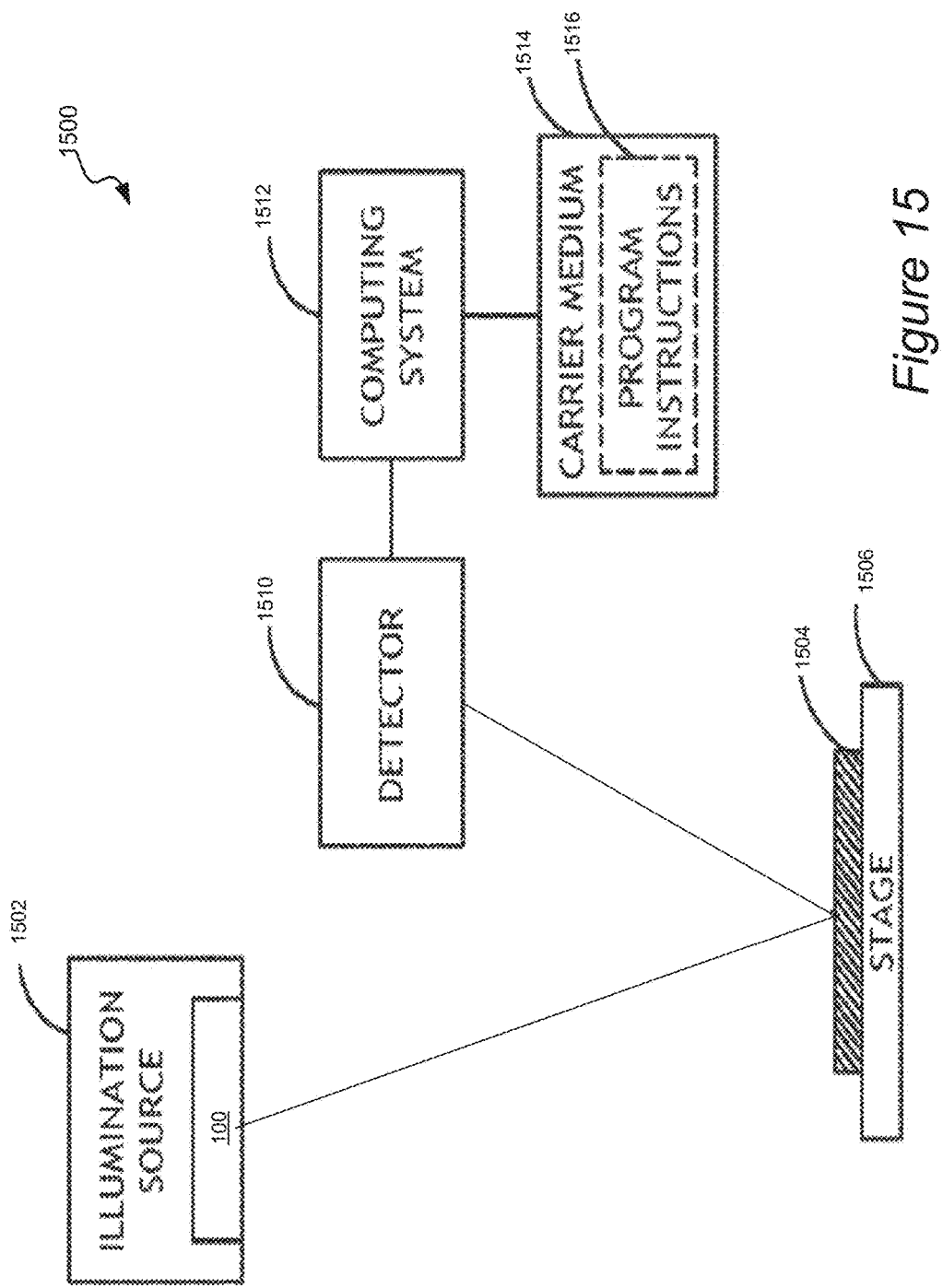
FIG. 15 provides a schematic representation of an inspection apparatus in accordance with certain embodiments.

Soft x-ray, EUV, VUV, or any other band of plasma-generated illumination may be used for semiconductor process applications, such as inspection, photolithography, or metrology. For example, as shown in FIG. 15, an inspection system 1500 may include an illumination source system 1502 incorporating a debris protection illumination source system, such as the illumination source system 100 described above. The inspection system 1500 may further include a stage 1506 configured to support at least one sample 1504, such as a semiconductor wafer or a mask. The illumination source 1500 may be configured to illuminate the sample 1504 via an illumination path, and illumination that is reflected, scattered, or radiated from the sample 1504 may be directed along an imaging path by any suitable collection optics to at least one detector 1510 (e.g. camera or array of photo-sensors. A computing system 1512 that is communicatively coupled to the detector 1510 may be configured to process signals associated with the detected illumination signals to locate and/or measure various attributes of one or more defects of the sample 1504 according to an inspection algorithms embedded in program instructions 1516 executable by a processor of the computing system 1512 from a non-transitory carrier medium 1514.

Figure 16:
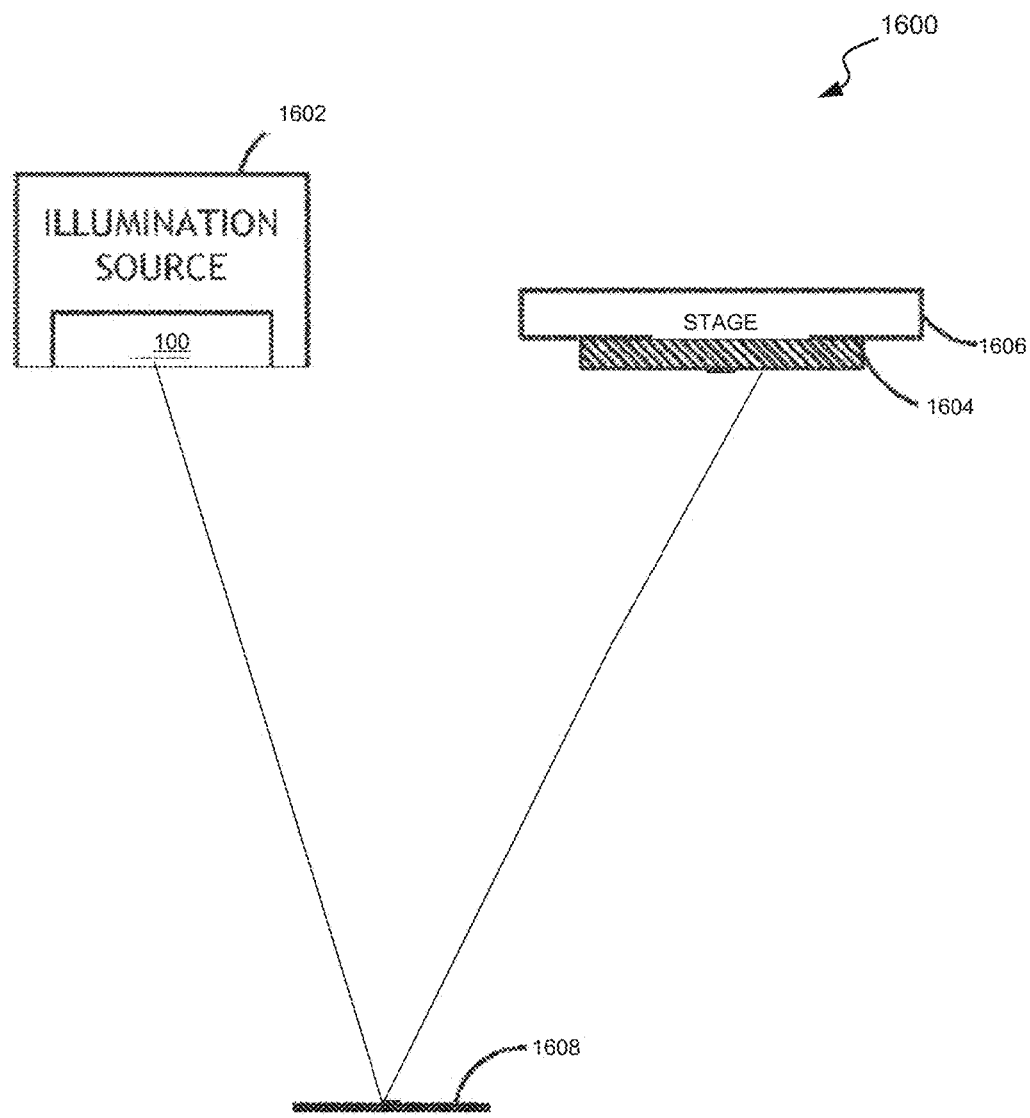
FIG. 16 is a simplified schematic representation of a lithographic system for transferring a mask pattern from a photomask onto a wafer in accordance with certain embodiments.

For further example, FIG. 16 generally illustrates a photolithography system 1600 including an illumination source 1602 incorporating a debris protection illumination source system, such as 100 described above. The photolithography system may include stage 1606 configured to support at least one substrate 1604, such as a semiconductor wafer, for lithography processing. The illumination source 1602 may be configured to perform photolithography upon the substrate 1604 or a layer disposed upon the substrate 1604 with illumination transferred by the illumination source system 100 along the illumination delivery path to an output of the illumination source 1602. For example, the output illumination may be directed from a reticle 1608 to the substrate 1604 to pattern the surface of the substrate 1604 or a layer on the substrate 1604 according an illuminated reticle pattern. The exemplary embodiments illustrated in FIGS. 15 and 16 generally depict applications of any of the debris-mitigated illumination source systems described above. However, those skilled in the art will appreciate that debris protection systems as described herein can be applied in a variety of contexts without departing from the scope of this disclosure.

Those having skill in the art will further appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. In some embodiments, various steps, functions, and/or operations are carried out by one or more of the following: electronic circuits, logic gates, multiplexers, programmable, logic devices, ASICs, analog or digital controls/switches, microcontrollers, or computing systems. A computing system may include, but is not limited to, a personal computing system, mainframe computing system, workstation, image computer, parallel processor, or any other device known in the art. In general, the term "computing system" is broadly defined to encompass any device having one or more processors, which execute instructions from a carrier medium. Program instructions implementing methods such as those described herein may be transmitted over or stored on carrier media. A carrier medium may include a transmission medium such as a wire, cable, or wireless transmission link. The carrier medium may also include a storage medium such as a read-only memory, a random access memory, a magnetic or optical disk, or a magnetic tape.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Figure 17:
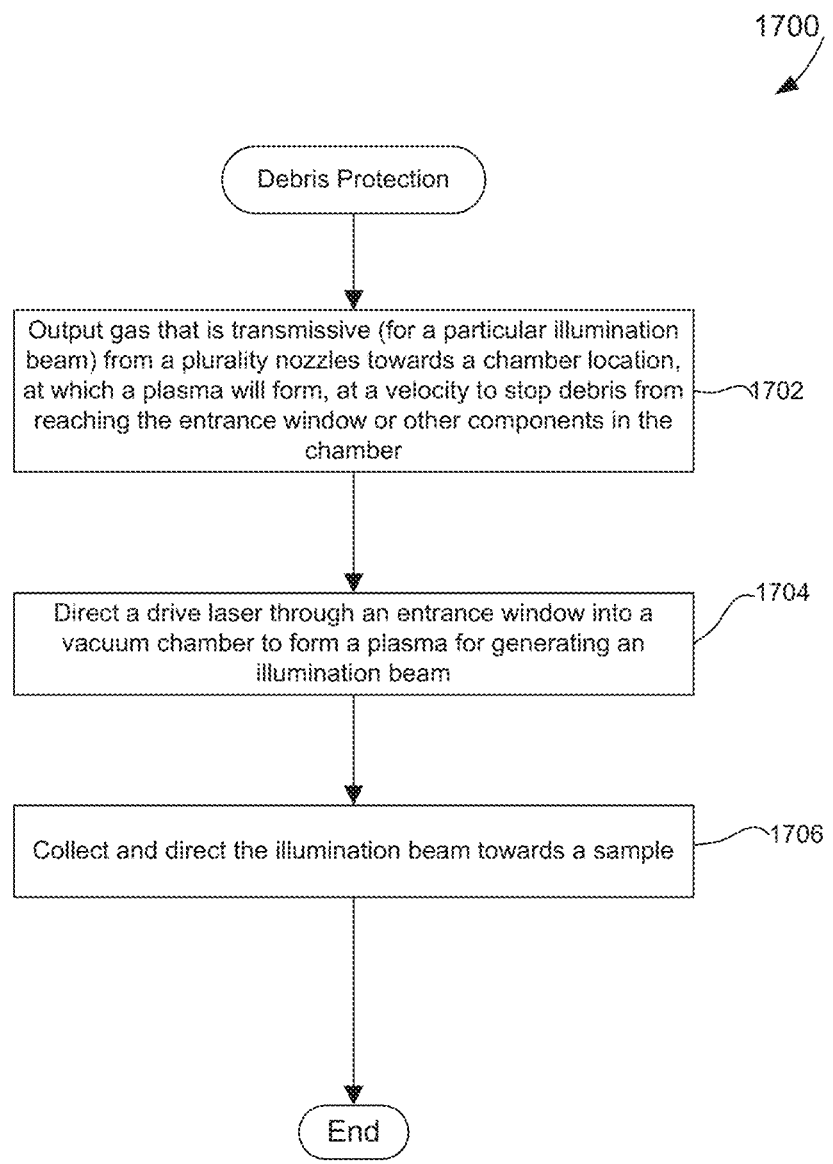
FIG. 17 is a flow chart illustrating a debris protection procedure in accordance with one embodiment of the present invention.

FIG. 17 is a flow chart illustrating a debris protection procedure 1700 in accordance with one embodiment of the present invention. Initially, a gas that is transmissive (for a particular illumination beam) is output from a plurality nozzles towards a chamber location, at which a plasma will form, at a velocity that is selected to stop debris from reaching the entrance window or other components in the chamber in operation 1702. A drive laser may be directed through an entrance window into the vacuum chamber to form a plasma for generating an illumination beam in operation 1704. The illumination beam is also collected and directed towards a sample, such as a wafer or reticle, in operation 1706.

Although the foregoing invention has been described in some detail for purposes of clarity of understanding, it will be apparent that certain changes and modifications may be practiced within the scope of the appended claims. It should be noted that there are many alternative ways of implementing the processes, systems, and apparatus of the present invention. Accordingly, the present embodiments are to be considered as illustrative and not restrictive, and the invention is not to be limited to the details given herein.

What is claimed is:

1. A plasma-based illumination apparatus for generating radiation, comprising:
   a vacuum chamber configured to hold a target material;
   an entrance window within a wall of such vacuum chamber;
   an illumination source system for generating at least one excitation source that is directed through the entrance window and focused on the target in the vacuum chamber for generating a plasma in the vacuum chamber so as to produce illumination radiation;
   a collector system for collecting and directing the produced illumination radiation towards a sample;
   a debris protection system having a manifold fluidly coupled with a plurality of nozzles that are positioned to surround the entrance window for flowing gas out of and away from the entrance window at a velocity towards the plasma so as to prevent debris from reaching such optical element resulting in a Peclet number averaged over a protected area of the entrance window that is greater than or equal to 2; and
   a baffle positioned downstream of each nozzle to prevent condensation at each nozzle's exit,
   wherein the debris protection system further comprises a gas source or gas inlet, wherein the manifold has a higher gas conductance than all the nozzles combined.

2. The apparatus of claim 1, wherein the produced radiation has an extreme ultraviolet (EUV) wavelength range that is equal to or less than 13.5 nm and the gas transmits EUV light.

3. The apparatus of claim 1, wherein the entrance window of the chamber is positioned between about 0.1 to 2.5 meters from the target material.

4. The apparatus of claim 1, wherein an area occupied by a plurality of openings of the nozzles is smaller than a surface area of the entrance window.

5. The apparatus of claim 1, wherein a flow rate of the gas is less than 20 standard liters per minute (slm).

6. The apparatus of claim 1, wherein the gas comprises one or more of the following gases: Ar, $H_2$, He, $Br_2$, HBr, or $N_2$.

7. The apparatus of claim 1, wherein each nozzle has a circular hole and the plurality of nozzles are arranged to produce a uniform gas stream, a planar gas curtain, or a ring-shaped jet.

8. The apparatus of claim 1, wherein the debris protection system further comprises a gas source or gas inlet, wherein the manifold has a higher gas conductance than all the nozzles combined.

9. The apparatus of claim 8, wherein the debris protection system includes a gas cone adjacent to or integral with the entrance window, in which the nozzles are formed, for directing the gas towards the plasma or another debris source.

10. The apparatus of claim 8, further comprising a pellicle positioned in front of the entrance window.

11. The apparatus of claim 8, wherein the debris protection system comprises a cone in which the nozzles are formed so as to flow the gas uniformly at an angle from the cone.

12. The apparatus of claim 11, further comprising a pellicle positioned between the entrance window and a source of debris, wherein the pellicle and/or entrance window are comprised of a sapphire material.

13. The apparatus of claim 8, wherein the manifold includes a first gas reservoir fluidly coupled to each nozzle and an intermediate stage fluidly coupled between each nozzle and the vacuum chamber, wherein the intermediate stage for each nozzle has a diameter larger than a diameter of such nozzle and smaller than a diameter of the vacuum chamber.

14. The apparatus of claim 1, further comprising a heating system for increasing a temperature of each nozzle to prevent condensation of the gas at each nozzle's exit.

15. The apparatus of claim 1, wherein the nozzles are evenly distributed around the entire periphery of the entrance window.

16. The apparatus of claim 1, wherein the nozzles have a count and/or size and/or temperature that is selected based on a computational fluid dynamics simulation to provide a predefined level of optics protection and to avoid gas condensation at each nozzle's exit.

17. An inspection system for inspecting a photolithographic reticle or wafer for defects and the sample is a wafer or reticle, the system comprising:
    an apparatus as recited in claim 1 for generating the illumination beam;
    imaging optics for directing the illumination radiation towards the reticle or wafer;
    a detector for receiving a detected signal or image from the reticle or sample in response to the illumination radiation being directed to the reticle or wafer; and
    a processor and memory that are configured to analyze the detected signal or image to thereby detect defects on the reticle or wafer.

18. A photolithography system for transferring a pattern from a reticle onto a wafer, comprising:
    an apparatus as recited in claim 1 for generating the illumination beam; and
    imaging optics for directing the illumination radiation via a reticle onto a wafer.

19. The system of claim 1, wherein the debris protection system is further configured for flowing gas out of the plurality of nozzles and away from the entrance window at a velocity towards the plasma so as to prevent debris from reaching such entrance window resulting in a Peclet number averaged over the protected area of the entrance window that is greater than or equal to 4.

20. The system of claim 1, further comprising an optical element in the form of a collector element, a metrology window, a filter, a deflector, or a mirror, wherein the debris protection system further comprises a second plurality of nozzles for flowing gas out of and away from the optical element.

* * * * *